US012813242B2

(12) United States Patent
Theil et al.

(10) Patent No.: US 12,813,242 B2
(45) Date of Patent: Nov. 24, 2026

(54) STRUCTURES AND METHODS TO MAXIMIZE CONTACT DENSITY ACROSS CAVITIES

(71) Applicant: Avago Technologies International Sales Pte. Limited, Singapore (SG)

(72) Inventors: Jeremy Theil, San Jose, CA (US); Mayank Mayukh, Fort Collins, CO (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 371 days.

(21) Appl. No.: 18/428,390

(22) Filed: Jan. 31, 2024

(65) Prior Publication Data

US 2025/0087560 A1 Mar. 13, 2025

Related U.S. Application Data

(60) Provisional application No. 63/581,203, filed on Sep. 7, 2023.

(51) Int. Cl.
*H10W 20/20* (2026.01)
*H10W 90/00* (2026.01)

(52) U.S. Cl.
CPC .......... *H10W 20/20* (2026.01); *H10W 90/794* (2026.01)

(58) Field of Classification Search
CPC ........... H10W 20/023; H10W 20/0698; H10W 20/212; H10W 20/2125; H10W 20/40; H10W 40/47; H10W 70/635; H10W 70/698
See application file for complete search history.

(56) References Cited

U.S. PATENT DOCUMENTS

| | | | | |
|---|---|---|---|---|
| 2010/0133697 | A1 | 6/2010 | Nilsson | |
| 2012/0273967 | A1 | 11/2012 | Do et al. | |
| 2013/0099368 | A1 | 4/2013 | Han | |
| 2018/0114743 | A1 | 4/2018 | Oganesian et al. | |
| 2020/0203256 | A1 | 6/2020 | Neal et al. | |
| 2023/0282546 | A1* | 9/2023 | Waidhas | H10W 40/73 257/678 |
| 2024/0030147 | A1* | 1/2024 | Duan | H10W 70/65 |

OTHER PUBLICATIONS

European Patent Office, Extended Search Report, Application No. 24198536.5, Feb. 14, 2025, 10 pages.

Steller, W. et al., Microfluidic Interposer for High Performance Fluidic Chip Cooling, In 2018 7th Electronic System- Integration Technology Conference (ESTC), IEEE, 2018, pp. 1-8.

* cited by examiner

*Primary Examiner* — Fazli Erdem
(74) *Attorney, Agent, or Firm* — Quarles & Brady LLP

(57) ABSTRACT

Novel tools and techniques are provided for implementing a semiconductor package or a chip package, and more particularly methods, systems, and apparatuses are provided for implementing a semiconductor package or a chip package including a one or more channel vias. In various embodiments, an apparatus includes a first layer comprising a channel; a first via extending though the first layer to a first surface of the channel; and a line connecting the first via to a pad. In some cases, the first surface is located at a bottom of the channel.

20 Claims, 18 Drawing Sheets

STRUCTURES AND METHODS TO MAXIMIZE CONTACT DENSITY ACROSS CAVITIES

CROSS-REFERENCE TO RELATED APPLICATION

This application claims priority to U.S. Patent Application Ser. No. 63/581,203 (the "'203 application"), filed Sep. 7, 2023, by Jeremy Theil, et al., entitled, "Structures and Methods to Maximize Contact Density Across Cavities," the disclosure of which is incorporated herein by reference in its entirety for all purposes.

COPYRIGHT STATEMENT

A portion of the disclosure of this patent document contains material that is subject to copyright protection. The copyright owner has no objection to the facsimile reproduction by anyone of the patent document or the patent disclosure as it appears in the Patent and Trademark Office patent file or records, but otherwise reserves all copyright rights whatsoever.

FIELD

The present disclosure relates, in general, to methods, systems, and apparatuses for implementing a semiconductor device comprising a channel with one or more vias.

BACKGROUND

When working with semiconductor devices in which channels, cavities, or voids exist, there are some constraints on routing traces or vias because there is an engineered channel, cavity, or void within the semiconductor device. Examples of situations where semiconductor devices comprise channels, cavities, or voids include when the semiconductor device comprises one or more coldplates (e.g., fluid coldplates or the like) across which signals (e.g., electrical signals, or the like) need to be passed or one or more vacuum cavities for sensors and transducers.

Through substrate vias (TSVs) are commonly used to pass the signals through a semiconductor device from or to one or more layers or dies. However, the number, amount, or density of TSVs may be limited in a semiconductor device or one or more areas of the semiconductor device where one or more channels, cavities, or voids are formed.

Hence, there is a need for more robust and scalable solutions for implementing semiconductor packages and chip packages with channels. Thus, methods, systems, and apparatuses are provided for implementing semiconductor packages or chip packages including a via extending through a layer to a bottom surface of a channel.

BRIEF DESCRIPTION OF THE DRAWINGS

A further understanding of the nature and advantages of particular embodiments may be realized by reference to the remaining portions of the specification and the drawings, in which like reference numerals are used to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION OF EMBODIMENTS

Figure 1:
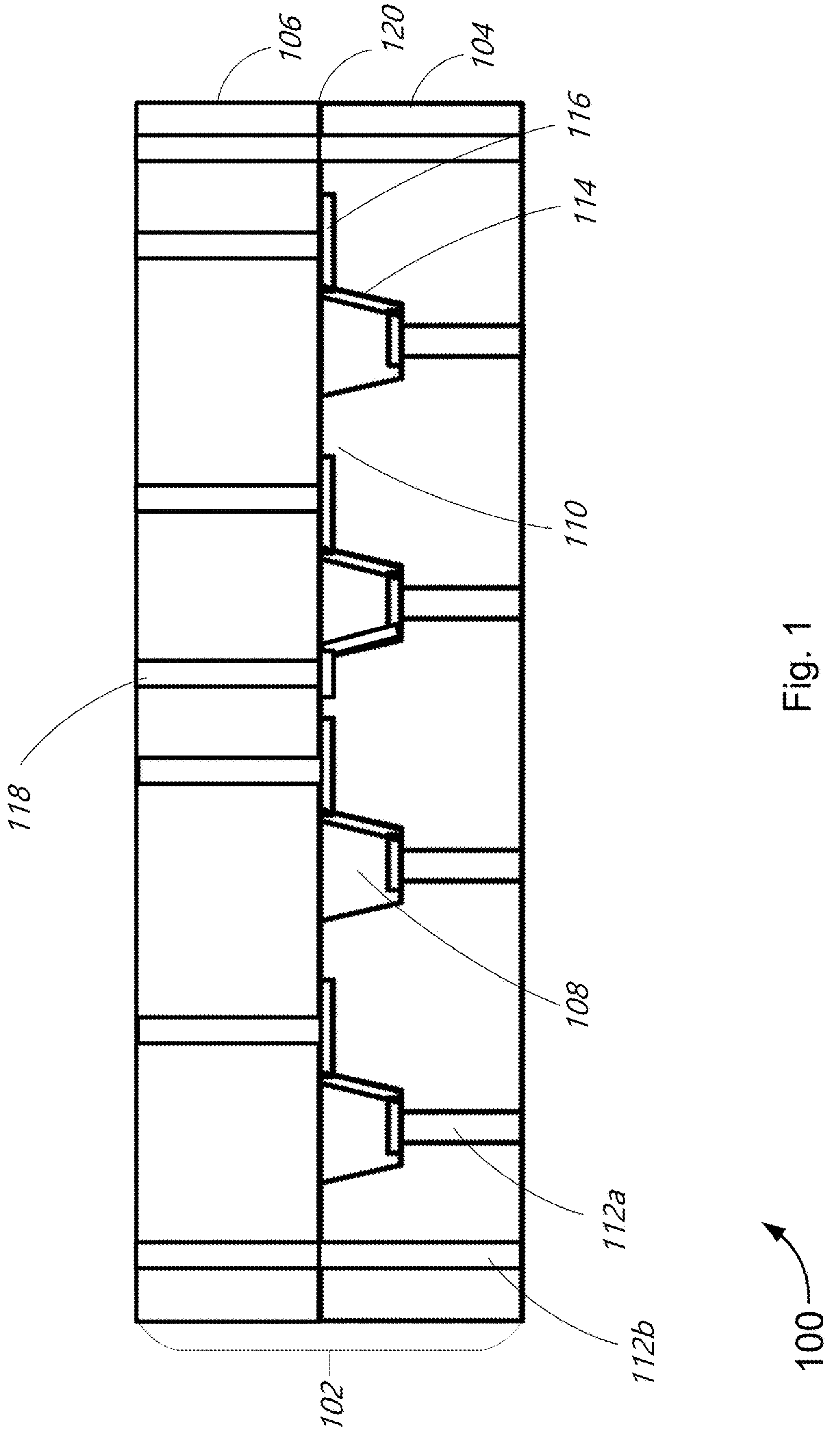
FIG. 1 is a schematic cross-sectional view of an embodiment of a semiconductor device with one or more channel vias, in accordance with various embodiments.

Various embodiments provide tools and techniques for implementing semiconductor packages or chip packages including one or more channels are described herein.

In a first aspect, a semiconductor device includes a first layer comprising a channel; a first via extending though the first layer to a first surface of the channel; and a line connecting the first via to a pad. In some cases, the first surface can be located at a bottom of the channel.

In some embodiments, the pad can be located on a ridge of the channel. The line can extend along a portion of a first wall of the channel to connect to the pad. The first wall of the channel can be sloped between about 20 degrees and about 87 degrees. In some embodiments, a second layer can be located between the first wall of the channel and the line. In various instances, the ridge further comprises a second via extending to a second surface of the ridge. The second surface can be located at a top of the ridge. A diameter of the first via can be less than a diameter of the second via.

In various instances, a second layer can be partially formed on the first layer to encapsulate at least one of a top of the first via or the line connecting the first via to the pad.

In some cases, the channel comprises a fluid. A second layer can be formed at a location to encapsulate a portion of the line. The location can be selected to prevent the portion of the line from contacting the fluid in the channel.

In various embodiments, the pad is located on top of a ridge of the channel. The semiconductor device further includes a second layer encapsulating the line, a third layer located on top of the ridge encapsulating the pad, and a top surface of the second layer can be lower than a top surface of the third layer.

In another aspect, a semiconductor device can include an array of vias, the array of vias comprising at least one first via extending through a layer to a bottom of a channel; and a line extending along a portion of the channel and connecting the at least one first via to a pad. In various cases, the pad can be located on a ridge of the channel.

In some instances, the array of vias comprises two or more vias arranged in two or more columns or two or more rows along the bottom of the channel. The array of vias can include at least one second via extending through the layer to a top of a ridge of the channel.

In some embodiments, the pad comprises a zero-clearance bondable surface.

In yet another aspect, a method of manufacturing a semiconductor device can include forming a via extending through a first layer; forming a channel in the first layer to expose a first surface of the via; and forming a line extending from the first surface of the via and configured to connect the via to a pad. In some cases, the first surface of the via is exposed on a bottom surface of the channel.

In various cases, the method can include, after forming the channel and before forming the line, forming a second layer on top of the first layer comprising the channel. The second layer can be a dielectric layer. The method can also include, after forming the line, forming a third layer on top of the line. The third layer can be a dielectric layer.

In some instances, forming the line further comprises forming the line to extend from the first surface of the via to the pad located on a ridge of the channel. The line can extend along a portion of a wall of the channel to connect to the pad.

In the following description, for the purposes of explanation, numerous details are set forth to provide a thorough understanding of the described embodiments. It will be apparent to one skilled in the art, however, that other embodiments may be practiced without some of these details. Several embodiments are described herein, and while various features are ascribed to different embodiments, it should be appreciated that the features described with respect to one embodiment may be incorporated with other embodiments as well. By the same token, however, no single feature or features of any described embodiment should be considered essential to every embodiment of the invention, as other embodiments of the invention may omit such features.

When an element is referred to herein as being "connected," "coupled," or "attached" to another element, it is to be understood that the elements can be directly connected or coupled to the other element, or have intervening elements present between the elements. In contrast, when an element is referred to as being "directly connected," "directly coupled," or "directly attached" to another element, it should be understood that no intervening elements are present in the "direct" connection or coupling between the elements. However, the existence of a direct connection or coupling does not exclude other connections or couplings, in which intervening elements may be present. As used throughout this disclosure, "connect," "connected," etc. can refer to a connection (e.g., electrical connection between one or more elements while "couple," "coupled," etc. can refer to a connection (e.g., mechanical or physical connection, link, or engagement) between one or more elements.

When an element is referred to herein as being "disposed" or "located" in some manner relative to another element (e.g., disposed on, disposed between, disposed under, disposed adjacent to, or disposed in some other relative manner), it is to be understood that the elements can be directly disposed or located relative to the other element (e.g., disposed directly on another element), or have intervening elements present between the elements. In contrast, when an element is referred to as being "disposed directly" or "located directly" relative to another element, it should be understood that no intervening elements are present in the "direct" example. However, the existence of a direct disposition does not exclude other examples in which intervening elements may be present.

Likewise, when an element is referred to herein as being a "layer," it is to be understood that the layer can be a single layer or include multiple layers. For example, a conductive layer may comprise multiple different conductive materials or multiple layers of different conductive materials, and a dielectric layer may comprise multiple dielectric materials or multiple layers of dielectric materials. When a layer is described as being coupled or connected to another layer, it is to be understood that the coupled or connected layers may include intervening elements present between the coupled or connected layers. In contrast, when a layer is referred to as being "directly" connected or coupled to another layer, it should be understood that no intervening elements are present between the layers. However, the existence of directly coupled or connected layers does not exclude other connections in which intervening elements may be present.

Moreover, the terms left, right, front, back, top, bottom, forward, reverse, clockwise and counterclockwise are used for purposes of explanation only and are not limited to any fixed direction or orientation. Rather, they are used merely to indicate relative locations and/or directions between various parts of an object and/or components. Additionally, terms such as first, second, third, are merely used to distinguish elements or components from each other and are not intended to imply an order or sequence unless expressly stated otherwise.

Furthermore, the methods and processes described herein may be described in a particular order for ease of description. However, it should be understood that, unless the context dictates otherwise, intervening processes may take place before and/or after any portion of the described process, and further various procedures may be reordered, added, and/or omitted in accordance with various embodiments.

Unless otherwise indicated, all numbers used herein to express quantities, dimensions, and so forth should be understood as being modified in all instances by the term "about." The term "substantially" or "about" used herein refers to variations from the reference value or ratio of ±10% or less (e.g., ±10%, ±5%, etc.), inclusive of the endpoints of the range.

In this application, the use of the singular includes the plural unless specifically stated otherwise, and use of the terms "and" and "or" means "and/or" unless otherwise indicated. Moreover, the use of the terms "including" and "having," as well as other forms, such as "includes," "included," "has," "have," and "had," should be considered non-exclusive. Also, terms such as "element" or "component" encompass both elements and components comprising one unit and elements and components that comprise more than one unit, unless specifically stated otherwise.

As used herein, the phrase "at least one of" preceding a series of items, with the term "and" or "or" to separate any of the items, modifies the list as a whole, rather than each member of the list (i.e., each item). The phrase "at least one of" does not require selection of at least one of each item listed; rather, the phrase allows a meaning that includes at least one of any one of the items, and/or at least one of any combination of the items. By way of example, the phrases "at least one of A, B, and C" or "at least one of A, B, or C" each refer to only A, only B, or only C; and/or any combination of A, B, and C. In instances where it is intended that a selection be of "at least one of each of A, B, and C," or alternatively, "at least one of A, at least one of B, and at least one of C," it is expressly described as such.

In existing semiconductor or chip packages, vias are commonly used to pass signals through a semiconductor device from or to one or more layers, parts, or components. However, the number, amount, or density of vias may be limited in a semiconductor device or one or more areas of the semiconductor device where one or more channels, cavities, or voids are formed.

The subject technology comprises a semiconductor or chip device (e.g., integrated circuit (IC), chip, or other semiconductor device or module) or interposer (e.g., an interface routing one or more electrical connections between at least two layers or the like) that provides one or more channels (e.g., channels, cavities, voids, openings, etc.). The semiconductor device can include one or more vias (e.g., ridge vias, ridge through substrate vias (TSVs), or the like) extending through one or more layers to a top surface of a ridge (e.g., a ridge, a fin, or the like) of the channel. The vias can be used to route one or more electrical connections through the one or more layers and can be used to ensure electrical contact across an interface (e.g., an interface where two layers couple together, an interface where a die is coupled to a substrate, an interface where two substrates are coupled together, an interface where a die is coupled to a coldplate (e.g., one or more layers comprising channels configured to a contain fluid), or any other interface where two parts of a semiconductor device are coupled together, or the like). However, only providing ridge vias extending through one or more layers to the top surface of the ridge of the channel, cavity, or void can limit the density or number of vias that can be formed within the semiconductor device.

Thus, the subject technology can further provide one or more channels having a via (e.g., a channel via, a channel TSV, or the like) extending to a bottom surface of the channel. In some embodiments, a line (e.g., a conductive line, a conductive strap, a conductive strip, or the like) can extend from the channel via up a wall of the channel and connect to one or more conductive elements on the ridge of the channel. By having a channel via extend to a bottom surface of the channel, several advantages can be realized. For example, a diameter of the channel via extending to the bottom surface of the channel can be smaller than a diameter of a ridge via extending to the top surface of the ridge. During manufacturing of a semiconductor device, a diameter of a via is determined based on an amount of material through which the via needs to extend and the technological limits of forming the via. In a non-limiting example, as a length of a via increases, a hole to form the via needs to increase in order to ensure that the hole is filled completely during the deposition of the material to form the via. Thus, as the via gets longer or deeper, the diameter of the via needs to increase. A diameter of the channel via can be less than a diameter of the ridge via because the channel has less substrate material for the channel via to extend through. Additionally, the channel vias can be closer together than the ridge vias because the cross-sectional area of the channel vias is smaller than the cross-sectional area of the ridge vias. Therefore, the channel vias extending to the bottom surface of the channel can be installed at a higher density than the (optional) larger diameter ridge vias extending to the top surface of the ridge.

FIG. 1 is a schematic cross-sectional view of an embodiment of a semiconductor device 100 or interposer, in accordance with various embodiments. The semiconductor device 100 can include a substrate 102 (e.g., a supporting material upon which or within which the elements of a semiconductor device are fabricated or attached). In various cases, the substrate 102 can be formed from one or more layers. The one or more layers can include, without limitation, one or more dielectric layers, one or more device layers, one or more conducting layers, one or more insulating layers, one or more redistribution layers, and/or the like. In this case, substrate 102 has a first layer 104 coupled to a second layer 106. However, substrate 102 could have more or less layers than the first layer 104 and second layer 106. In some cases, the substrate 102 can be formed from silicon or other substrate material.

In some embodiments, the first layer 104 of the substrate 102 can include one or more channels 108 (e.g., channels, cavities, voids, etc.) and one or more ridges 110. In various cases, the substrate 102 could be a coldplate comprising one or more channels, one or more components comprising one or more vacuum cavities, or one or more other components comprising one or more channels, or the like. In some cases, for example, when the substrate 102 is a coldplate, the one or more channels 108 can contain or can be configured to contain a liquid. In a non-limiting example, the liquid could be a liquid configured to cool the semiconductor device 100, one or more active devices (e.g., transistors, diodes, or the like) located on or within semiconductor device 100, one or more device dies of the semiconductor device, or the like. In some cases, the liquid could be water or other liquid configured to cool the semiconductor device 100, the one or more active devices, one or more device dies, or the like. In some cases, when the substrate 102 comprises one or more vacuum cavities, the vacuum cavities could comprise one or more sensors, one or more transducers, or the like.

In various cases, the semiconductor device 100 might further include a device die (not shown). The device die can include, without limitation, one or more circuits and/or one or more active devices configured to perform a function. In various cases, the one or more channels 108 might be located near the device die and be configured to dissipate or transfer heat from the device die. In some cases, layer 104 could be directly coupled to a device die. In various cases, the second layer 106 could comprise the device die or be the device die.

In some instances, the semiconductor device 100 can further include one or more vias 112. The one or more vias might include at least one via 112*a* (e.g., one or more channel vias 112*a*) extending through one or more layers of the substrate 102 to a bottom surface of the channel 108. In some cases, the one or more vias 112 might additionally include at least one via 112*b* (e.g., one or more ridge vias 112*b*) extending through the one or more layers of the substrate 102 to a top surface of the ridge 110. In some cases, the at least one via 112*b* might not be included in the semiconductor device 100.

The one or more vias 112 can include, without limitation, one or more through silicon vias and/or one or more through substrate vias (TSVs). The one or more vias 112 can be configured to extend completely through the substrate 102 (e.g., a "through" via) and can be formed from a conductive material. The conductive material of the one or more vias 112 can include a metal such as copper, tungsten, nickel, aluminum, gold, silver, tin, or a combination of metals/alloys, or may be formed of other electrically conductive material or combination of electrically conductive materials. The one or more vias 112 can be configured to form one or more electrical connections for power or one or more signals to travel through the semiconductor device 100, the substrate 102, and/or the device die.

In some cases, the semiconductor device 100 can further include one or more lines 114 (e.g., a conductive line, a conductive strap, a conductive strip, a conductive trace, a conductive wire, a conductive band, or the like). The one or more lines 114 can be configured to connect to one or more conductive surfaces or pads 116 (e.g., one or more conductive elements, one or more conductive lines, one or more bonding pads or bonding surfaces, one or more via pads, or the like). In some cases, the one or more pads 116 can be located on a top surface of the one or more ridges 110, within the one or more channels 108, or along one or more walls of the one or more channels 108. In some examples, the one or more lines 114 or pads 116 can be formed of a metal such as copper, aluminum, gold, silver, tin, nickel, or a combination of metals/alloy, or may be formed of other electrically conductive material or combination of materials.

In various cases, the one or more lines 114 and/or pads 116 can be configured to connect to one or more vias 118 located in the second layer 106 of the substrate 102. In some cases, the vias 118 can be configured to extend completely through the second layer 106 or may extend through the second layer 106 from one outer surface (e.g., a "blind" via), and/or the like. The conductive material of the one or more vias 118 can include a metal such as copper, tungsten, aluminum, gold, silver, tin, nickel, or a combination of metals/alloy, or may be formed of other electrically conductive material or combination of materials.

In some cases, layer 106 can include one or more features or components described above with respect to layer 104. In a non-limiting example, layer 106 could also have one or more channels and ridges, one or more channel vias or ridge vias, one or more lines, or the like. In various cases, layer 106 could mirror the one or more features or components described above with respect to layer 104.

The one or more vias 112 and one or more lines 114 of the semiconductor device 100 are further described below with respect to FIGS. 2-8.

Turning to FIGS. 2-7, FIGS. 2-7 represent different embodiments of a bottom portion of a substrate 200*a*-200*f*, (collectively, substrate 200), in accordance with various embodiments. The substrate 200 can be similar to the substrate 102 described with respect to FIG. 1 above. Further, as noted above, the embodiments are not limited to only substrates and embodiments of this disclosure could also apply to coldplates, other components of a semiconductor device such as one or more components comprising vacuum cavities, or other semiconductor components comprising channels. In addition, although FIGS. 2-7 represent different embodiments of substrate 200, a person of ordinary skill would understand that various modifications to each embodiment may be applied to other embodiments.

Figure 2:
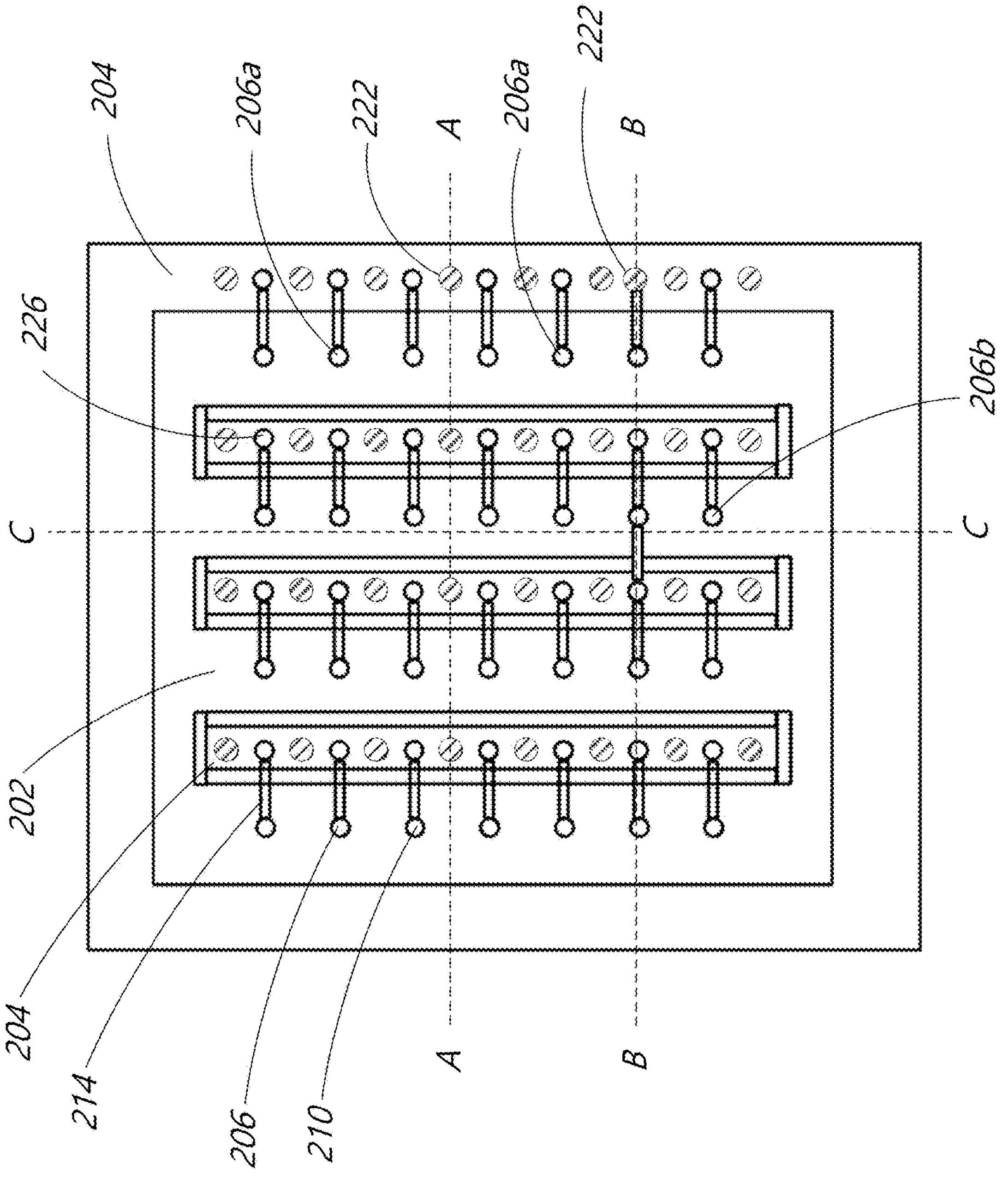
FIG. 2 is a top view of a bottom part of a substrate with one or more channel vias, in accordance with various embodiments.
Figure 3A:
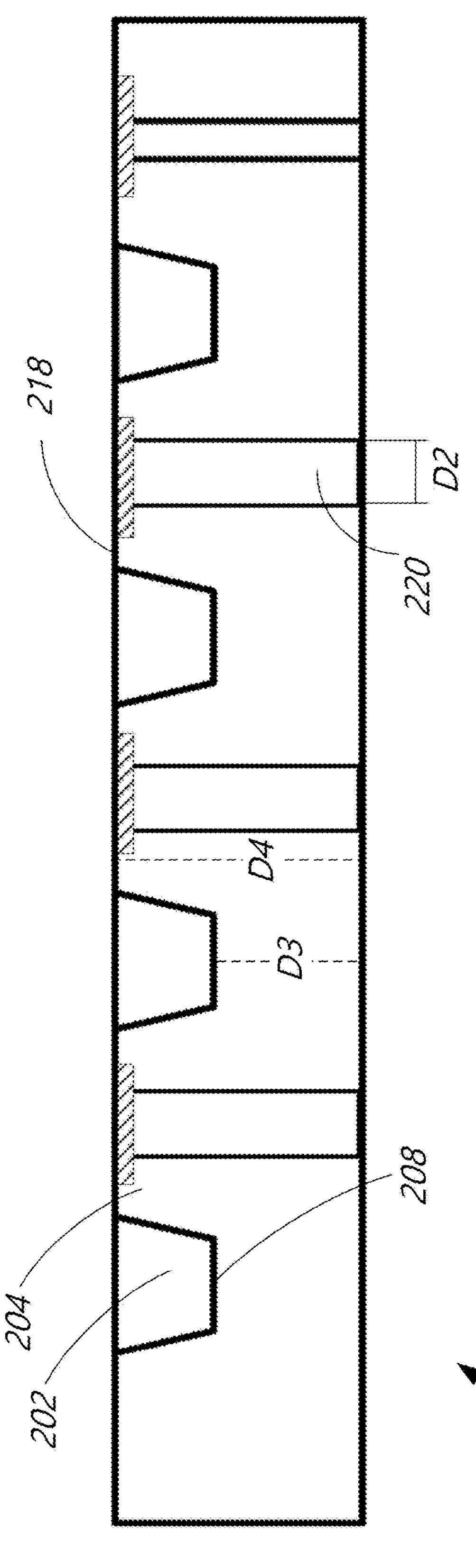
FIGS. 3A and 3B are schematic cross-sectional views of the bottom part of the substrate of FIG. 2, in accordance with various embodiments.
Figure 3B:
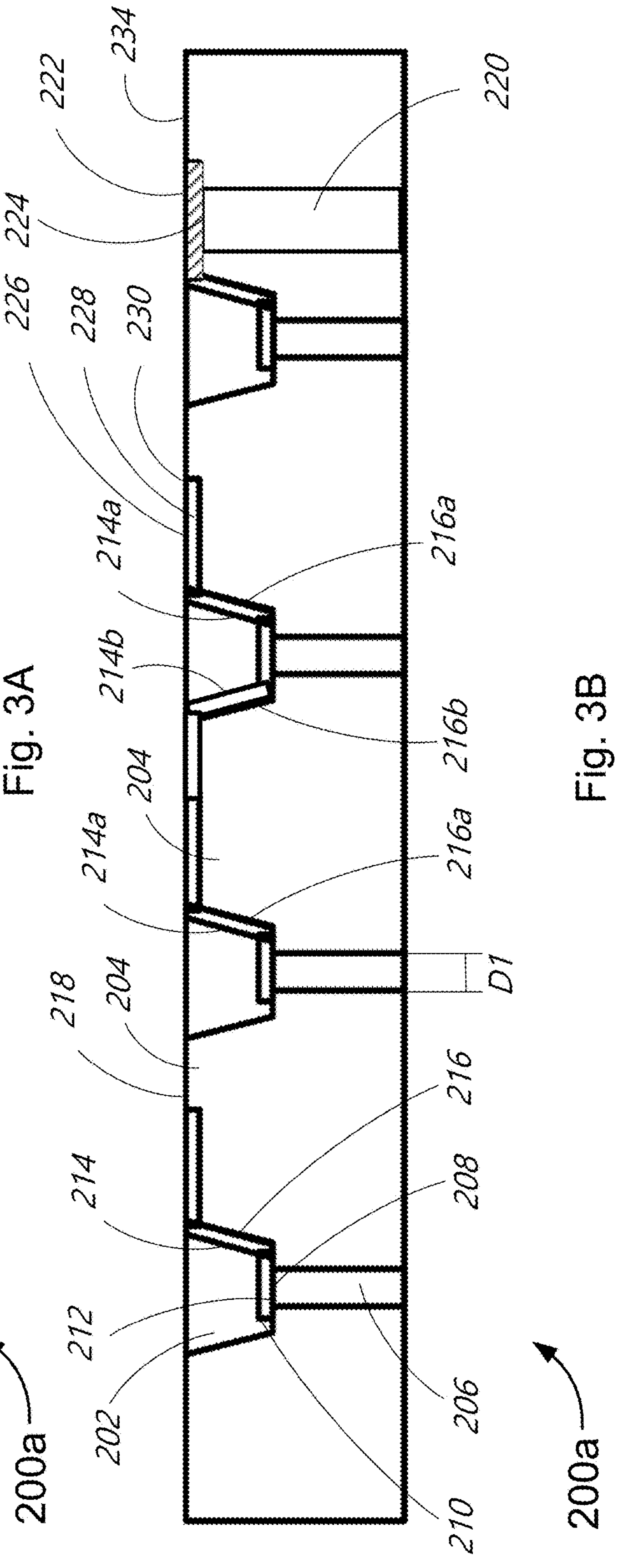

FIG. 2 is a schematic top view of an embodiment of a portion of a substrate 200*a*, in accordance with various embodiments. FIG. 3A is a cross-sectional view of the substrate 200*a* of FIG. 2 taken along the line A-A while FIG. 3B is a cross-sectional view of the substrate 200*a* taken along the line B-B. FIGS. 3-7 represent top views of different configurations or embodiments of the substrate 200*b*-200*f*, in accordance with various embodiments.

In some embodiments, the substrate 200 can include one or more channels 202 and one or more ridges 204. The one or more channels 202 can contain or can be configured to contain a liquid. In a non-limiting example, the liquid could be a liquid configured to cool the semiconductor device 100, one or more active devices located on or within semiconductor device 100, one or more device dies of the semiconductor device, or the like.

The substrate 200 can further include one or more vias 206 (e.g., channel vias) extending to a bottom surface 208 of a channel 202. The one or more vias 206 can include, without limitation, one or more through silicon vias and/or one or more through substrate vias (TSVs). The one or more vias 206 can be configured to extend completely through the substrate 200 and can be formed from a conductive material. The one or more vias 206 can be configured to form an electrical connection for power or one or more signals to travel through the substrate 200.

Figure 5:
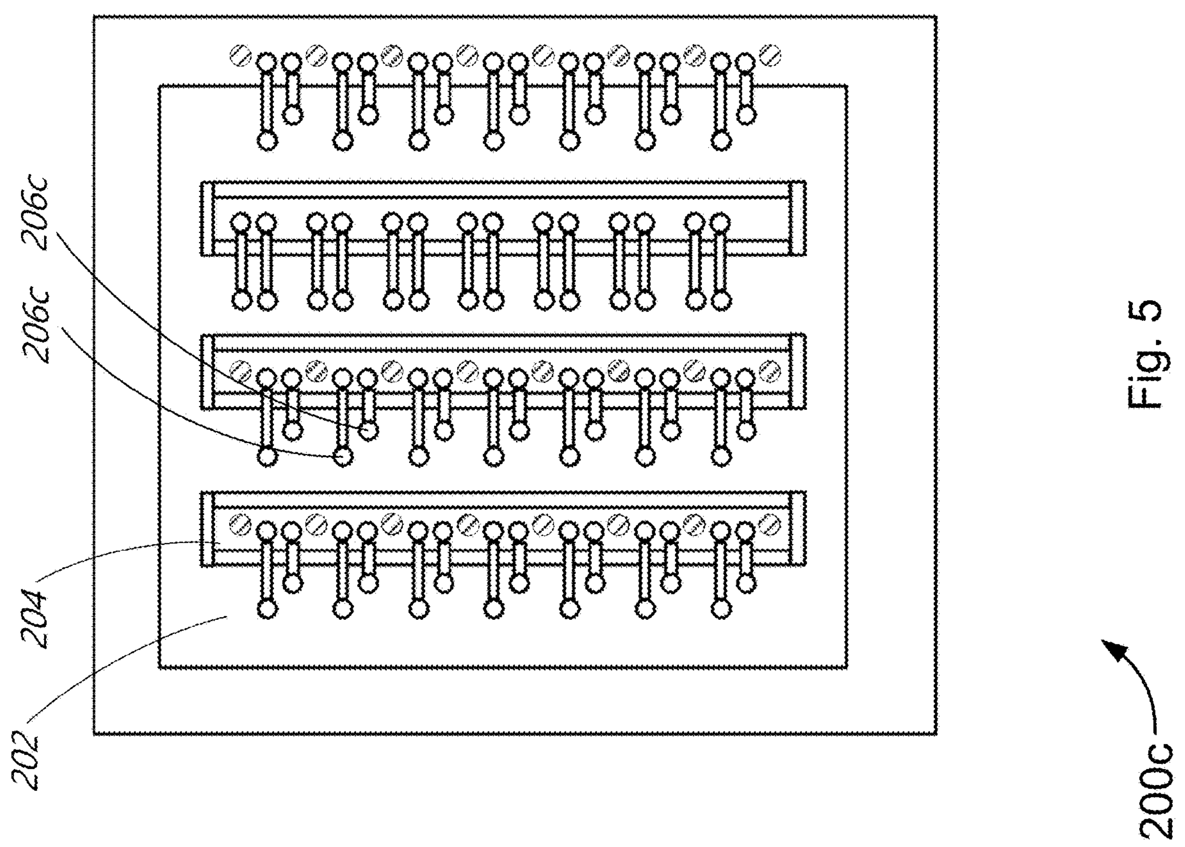
FIG. 5 is a top view of the bottom part of the substrate with one or more channel vias, in accordance with various embodiments.
Figure 4:
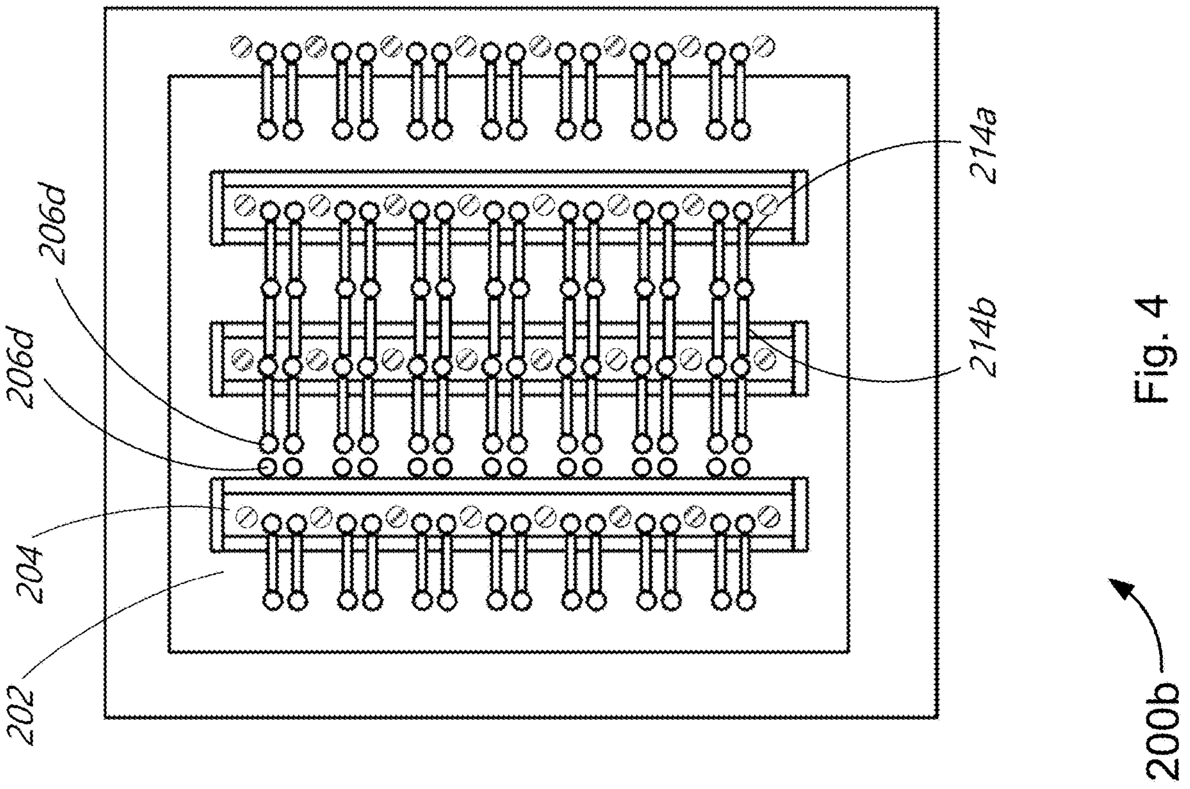
FIG. 4 is a top view of the bottom part of the substrate with one or more channel vias, in accordance with various embodiments.

The one or more vias 206 can be arranged in various ways within the one or more channels 202. In various cases, as shown in FIG. 2, the one or more vias 206*a* can be arranged along about a center of the one or more channels 202. In some cases, as shown in FIG. 2, the one or more vias 206*b* can be arranged in parallel to an axis C-C extending along the one or more channels 202. In some instances, as shown in FIG. 4, the one or more vias 206*d* can be arranged within one or more rows or columns within the one or more channels 202. In some instance, two-dimensional orthogonal or non-orthogonal arrays of vias 206 can be formed within the one or more channels 202 as shown in FIGS. 4 and 5. In some cases, the one or more vias 206*c* can be arranged in one or more staggered columns or rows or offset from one another within the channels 202 as shown in FIG. 5. By arranging the one or more vias 206 in one or more rows or columns within the channels 202, a higher number or density of vias 206 can be obtained.

In some embodiments, shown in FIG. 3B, the one or more vias 206 can include one or more optional via pads 210 (e.g., one or more conductive elements, one or more conductive connections, one or more conductive bonds, or the like) formed on the bottom surface 208 of the channel 202 and connected to a top surface 212 of the one or more vias 206. In some instances, the one or more vias pads 210 surround a top surface 212 of the one or more vias 206. In some examples, the one or more vias pads 210 may be formed of a metal such as copper, tungsten, aluminum, gold, silver, tin, nickel, or a combination of metals/alloy, or may be formed of other electrically conductive material or combination of materials.

In some instances, the substrate 200 can further include one or more lines 214 (e.g., a conductive line, a conductive strap, a conductive strip, a conductive trace, a conductive wire, a conductive band, or the like). The one or more lines 214 can be configured to connect to the one or more via pads 210. Alternatively, the one or more lines 214 can be configured to connect to the top surface 212 of the one or more vias 206.

In various embodiments, as shown in FIG. 3B, the one or more lines 214 can be configured to extend along a wall 216 of the channel 202 to a top surface 218 of a ridge 204 of the channel 202. In some cases, the one or more lines 214*a* can extend only along one wall 216*a* of the channel 202. In other cases, the one or more lines 214*a* and 214*b* can extend along both walls 216*a* and 216*b* of the channel 202 as shown in FIGS. 2, 3B, and 4. In some cases, a portion of the one or more lines 214 can also extend along a top surface 218 of the one or more ridges 204.

The wall 216 of the channel 202 can be sloped between about 20 degrees and about 87 degrees relative to the bottom surface 208 of the channel 202 and can preferably be about 70 degrees relative to the bottom surface 208 of the channel 202. However, in some cases, the wall 216 can be about vertical (e.g., about 90 degrees relative to a bottom surface 208 of the channel 202). When the wall 216 is sloped, the one or more lines 214 extending along the wall 216 of the channel can be sloped about a same amount as the wall 216 relative to the bottom surface 208 of the channel 202.

In various instances, the substrate 200 might further include one or more vias 220 (e.g., ridge vias) extending through one or more layers of the substrate 200 to the top surface 218 of the ridge 204 as shown in FIGS. 2, 3A, and 3B. In various cases, as shown in FIGS. 3A and 3B, a diameter D1 of the one or more channel vias 206 can be smaller than a diameter D2 of the one or more ridge vias 220. The diameter D1 of the one or more channel vias 206 can be smaller than a diameter D2 of the one or more ridge vias 220 because the distance D3 to the bottom surface 208 of the channel 202 or a length of the one or more channel vias 206 is shorter than a distance D4 to the top surface 218 of the ridge 204 or a length of the one or more ridge vias 220.

In some embodiments, the one or more vias 220 can include one or more optional via pads 222 (e.g., one or more conductive elements, one or more conductive connections, one or more conductive bonds, or the like) shown by the one or more circles on the top surface 218 of the ridge 204 comprising a line pattern fill in FIGS. 2 and 4-6. The one or more via pads 222 can be connected to a top surface 224 of the one or more vias 220. In some instances, the one or more via pads 222 surround a top surface 224 of the one or more vias 220. In some examples, the one or more via pads 222 may be formed of a metal such as copper, tungsten, aluminum, gold, silver, tin, nickel, lead, or a combination of metals/alloy, or may be formed of other electrically conductive material or combination of materials. In various cases, the one or more via pads 222 can be configured to connect to one or more corresponding conductive elements on another layer or component of a semiconductor device as shown in FIG. 1.

In addition to or in alternative to the one or more vias 220 or via pads 222, the substrate 200 can further include one or more bonding surfaces 226 shown by the one or more circles on the top surface 218 of the ridge 204 comprising no pattern fill in FIGS. 2 and 4-6. The one or more bonding surfaces 226 can include one or more zero-clearance bonding surfaces such as one or more hybrid bonding surfaces, one or more direct bonding surfaces, one or more surface activated bonding surfaces, or the like. The one or more hybrid bonding surfaces can include one or more surfaces that have more than one material (e.g., a combination of an insulator or dielectric material and a conductive material, or the like). The one or more direct bonding surfaces can include directly bonding two surfaces (e.g., two layers) together without intermediate layers between the two surfaces. The one or more surface activated bonding surfaces can comprise one or more surfaces that are chemically treated or treated with a plasma process to enhance bond energy between the one or more surfaces.

In various cases, the one or more bonding surfaces 226 can comprise one or more bonds that combine a dielectric material (e.g., silicon oxide, or the like) with an embedded metal (such as one or more bonding pads 228) to form one or more interconnections (e.g., interconnections between layers 104 and 106 of the substrate 102 or interconnections between other parts or components of a semiconductor device, or the like). The embedded metal can include, without limitation, a metal such as copper, tungsten, nickel, aluminum, gold, silver, tin, or a combination of metals/alloy, or may be formed of other electrically conductive material or combination of materials.

In some instances, the one or more bonding pads 228 of the one or more bonding surfaces 226 can be located on the top surface 218 of the ridge 204. The top surface 224 of the one or more vias 220, the one or more via pads 222, and/or a top surface 230 of the one or more bonding pads 228 can be located at an interface 234 (or interface 120 shown in FIG. 1) of the substrate 200 (or substrate 102) or at an interface 234 of the substrate 200 and one or more other semiconductor components. The one or more bonding pads 228 can be configured to connect to one or more corresponding conductive elements on another layer or component of a semiconductor device as shown in FIG. 1.

In various cases, the one or more lines 214 can be configured to extend along the wall 216 of the channel 202 to the top surface 218 of the ridge 204 of the channel 202 and connect to the top surface 224 of the one or more vias 220, to the one or more via pads 222, or to the top surface 230 of the one or more bonding pads 228, or the like.

Figure 6:
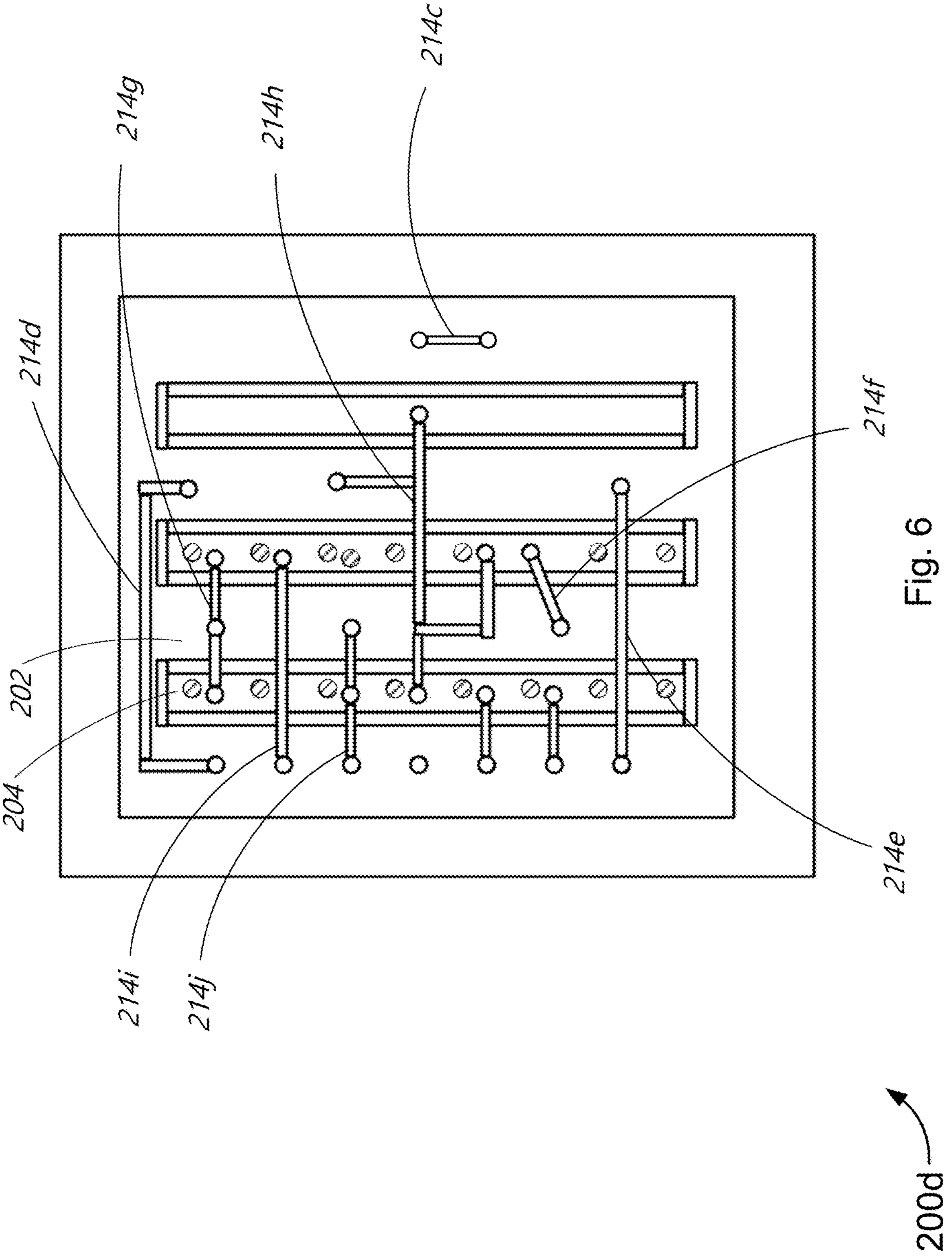
FIG. 6 is a top view of the bottom part of the substrate with one or more channel vias, in accordance with various embodiments.

The one or more lines 214 can be arranged in a variety of ways within substrate 200. For example, as shown in FIG. 6, one or more lines 214*c* can extend within the channel 202 and connect two or more vias 206 together or two or more via pads 210 together. Additionally, as shown by line 214*d* in FIG. 6, the one or more lines 214*d* can extend around one or more ridges 204 and connect two or more vias 206 together. In some embodiments, as shown in FIG. 6, a line 214*e* can extend over one or more ridges 204 to connect two or more vias 206 together. In some cases, as shown by line 214*f* in FIG. 6, the one or more lines 214*f* can extend from a corresponding via 206 at angle and up and along the wall 216 of the channel 202 to connect to one or more other conductive elements (e.g., one or more vias 206, one or more via pads 210, one or more vias 220, one or more via pads 222, and/or one or more bonding pads 228, or the like).

In some cases, as shown in FIG. 6, one or more lines 214*g* can extend from one or more vias 206 up wall 216*a* and wall 216*b* of the channel 202 to connect to at least two of the one or more vias 220, the one or more via pads 222, and/or the one or more bonding pads 228, or the like. In some cases, as shown by line 214*h* in FIG. 6, the one or more lines 214*h* can extend through channels 202 to connect at least two of the one or more vias 220, the one or more via pads 222, and/or the one or more bonding pads 228, or the like together. In some cases, the line 214*h* might not connect to a channel via 206. In other cases, the line 214*h* can connect to a channel via 206. In some cases, one or more lines 214*i* can extend from a via 206 to at least one of the one or more vias 220, the one or more via pads 222, and/or the one or more bonding pads 228 on a ridge 204 that is not directly adjacent to channel 202 comprising the via 206. In some cases, two channel vias 206 can be connected to at least one of the one or more vias 220, the one or more via pads 222, and/or the one or more bonding pads 228 via one or more lines 214*j*.

These are only some of the arrangements that are possible with the one or more lines 214 and many other arrangements are possible and are within the scope of the embodiments. In various cases, the one or more lines 214 can be routed between, around, over, along, or across the channels and ridges and connected to the one or more vias 206, the one or more via pads 210, the one or more vias 220, the one or more via pads 222, and/or the one or more bonding pads 228, or the like in any arrangement as required by design, without limitation.

Figure 7A:
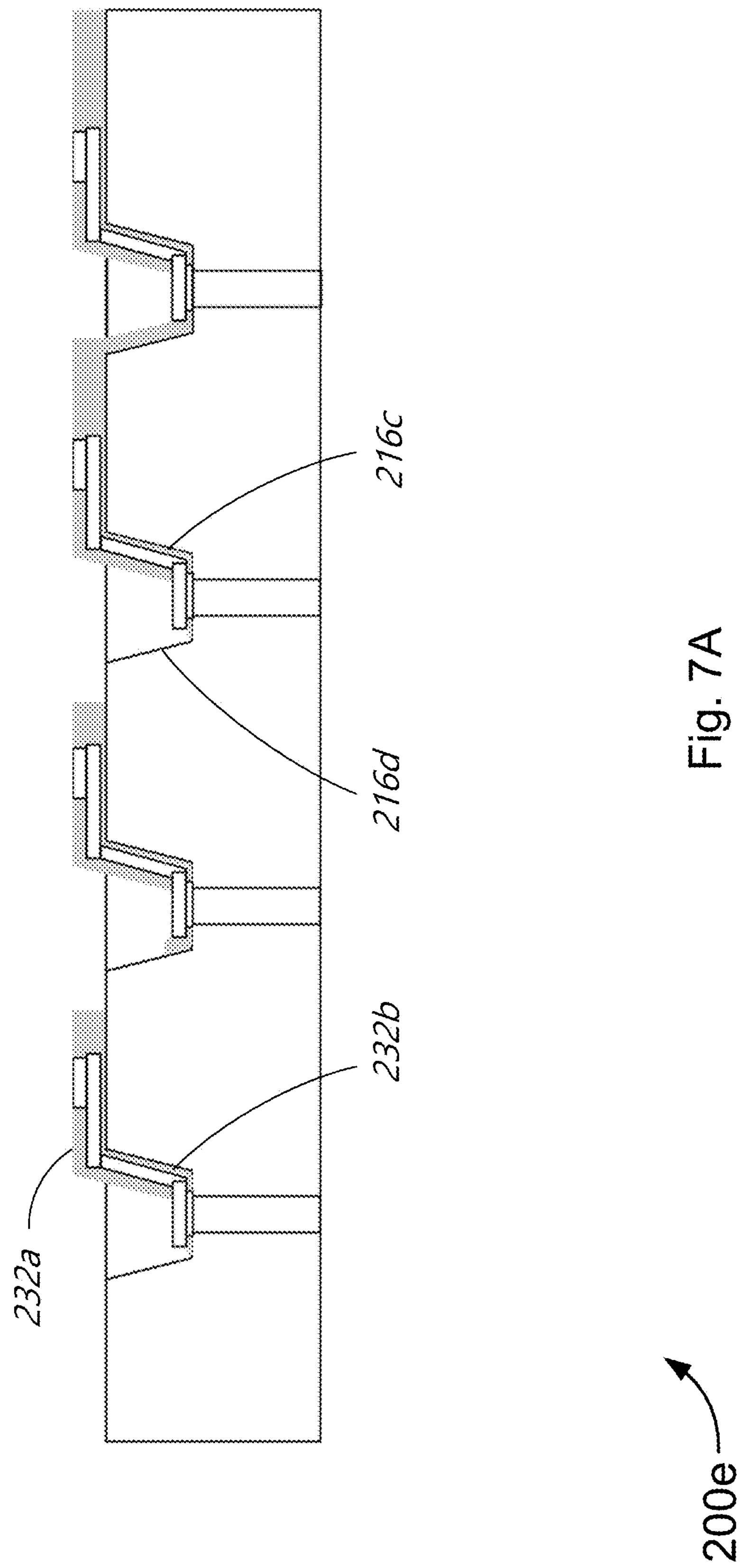
FIG. 7A is a schematic cross-sectional view of the bottom part of the substrate of FIG. 2 comprising one or more dielectric layers, in accordance with various embodiments.
Figure 7B:
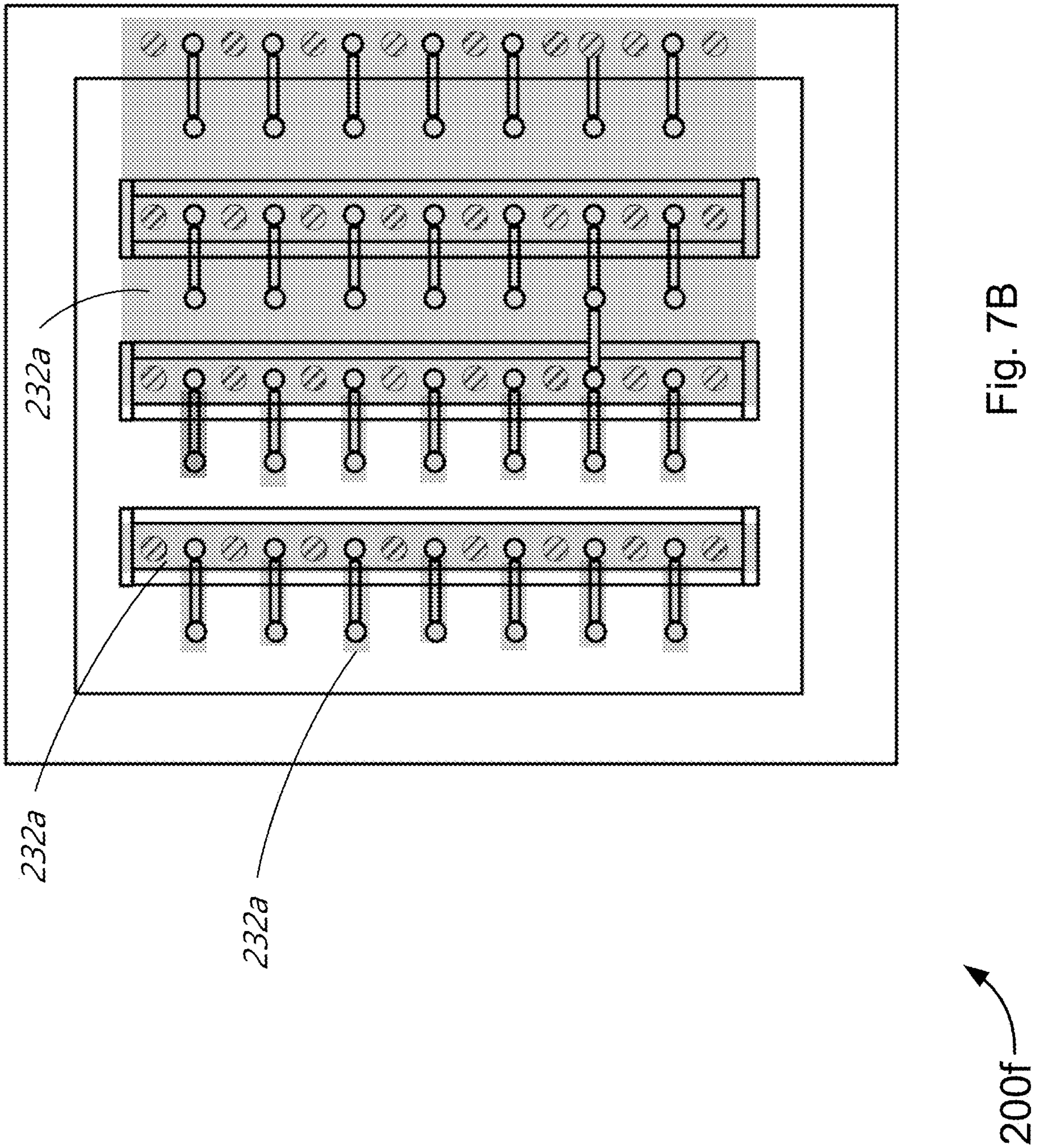
FIG. 7B is a top view of the bottom part of the substrate of FIG. 2 comprising one or more dielectric layers, in accordance with various embodiments.

In yet another embodiment, as shown in FIGS. 7A and 7B, one or more layers 232*a* (shown by transparent shaded area 232*a* in FIG. 7B) and 232*b* can optionally be deposited underneath and/or on top of the one or more lines 214, the one or more vias 206, the one or more via pads 210, the one or more via pads 222, and/or the one or more bonding pads 228. The one or more layers 232*a* and 232*b* can be one or more dielectric layers or insulating layers. The one or more layers 232*a* and 232*b* can be formed from inorganic material such as silicon dioxide, silicon nitride, silicon carbon nitride, or organic material such as a photodefinable or non-photo-defineable polymer, and/or another other material suitable for use as a dielectric layer or insulating layer. The one or more layers 232*a* and 232*b* can be selectively located at locations where the one or more lines 214, the one or more via pads 210, the one or more via pads 222, and/or the one or more bonding pads 228 are formed. In a non-limiting example, the one or more layers 232*a* and 232*b* can be deposited on a first wall 216*c* of the one or more channels 202 while the one or more layers 232*a* and 232*b* are not deposited on wall 216*d*.

By selectively locating the one or more layers 232*a* and 232*b* at locations where the one or more lines 214, the one or more vias 206, the one or more via pads 210, the one or more via pads 222, and/or the one or more bonding pads 228 are formed, heat transfer can be increased between the substrate 200 and another component (e.g., a device die) of the semiconductor device. However, the one or more layers 232*a* and 232*b* can fully cover any portions of metal that would otherwise come in contact with a fluid contained within the one or more channels 202. By covering the one or more lines 214, the one or more vias 206, the one or more via pads 210, the one or more via pads 222, and/or the one or more bonding pads 228 with the one or more layers 232*a* and 232*b*, corrosion or other unwanted chemical reactions can be prevented.

Figure 8A:
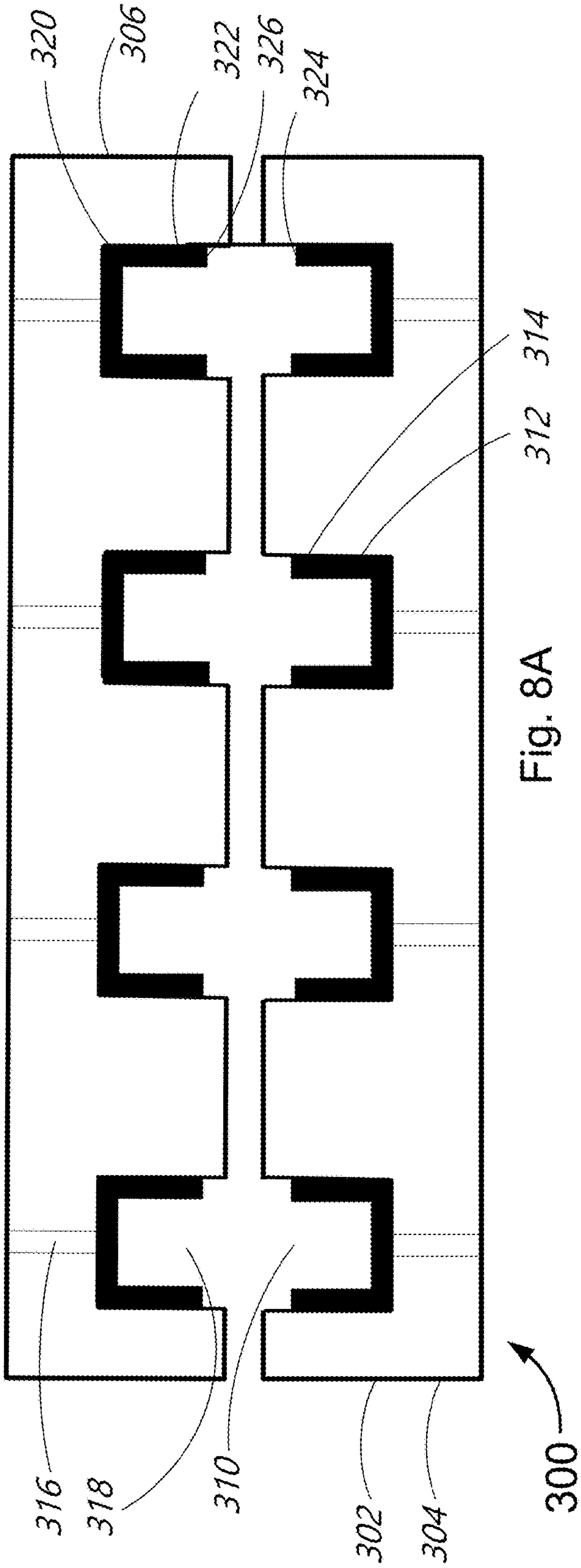
FIGS. 8A and 8B are schematic cross-sectional views of a different embodiment of a semiconductor device with one or more channel vias, in accordance with various embodiments.
Figure 8B:
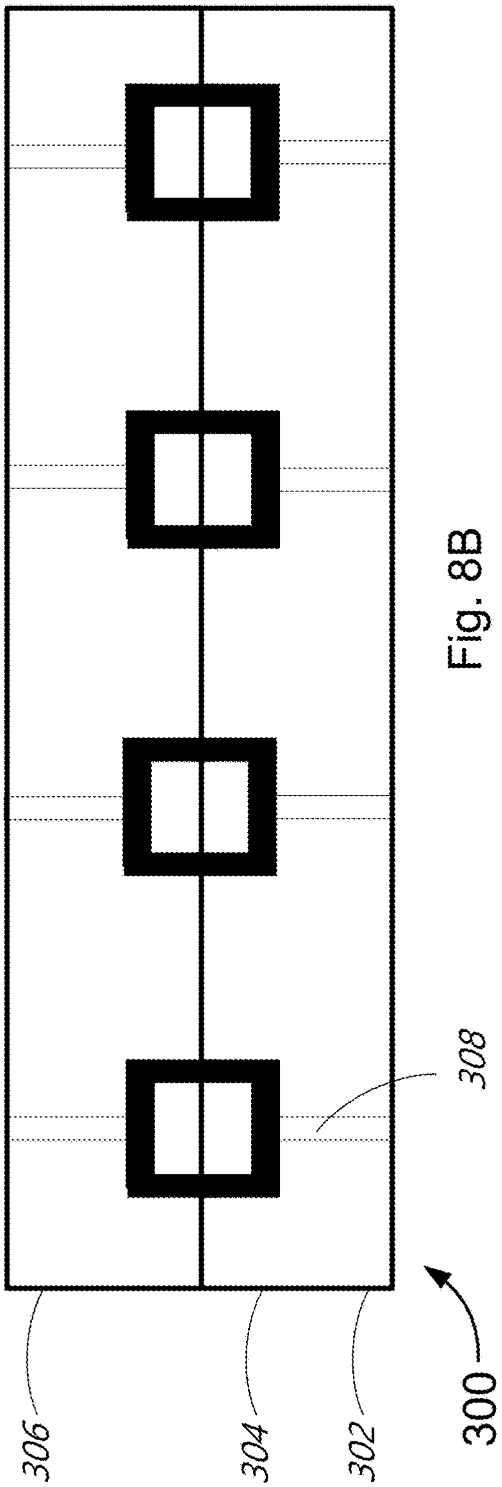

In yet another embodiment, as shown in FIG. 8, a semiconductor device 300 can include a substrate 302 (or other component of a semiconductor device having channels, or the like) having a first layer 304 and a second layer 306.

In various embodiments, the first layer 304 of the substrate 302 can include one or more channel vias 308 (similar to channel vias 206 described in FIGS. 2-7) extending to a bottom surface of a channel 310. The first layer 304 can further include one or more lines 312 (similar to lines 214 described with respect to FIGS. 2-7) extending from the one or more vias 308 along one or more walls 314. In various cases, a bonding pad (e.g., similar to bonding pads 228 or via pads 210 or 222) could be connected to a top surface 324 of the one or more lines 312. A second layer 306 (e.g., a second layer of the substrate, a device die, or the like) of the semiconductor device 300 can include one or more channel vias 316 (similar to channel vias 206 described in FIGS. 2-7) extending to a bottom surface of a channel 318. The second layer 306 can further include one or more lines 320 extending along one or more walls 322 that correspond to the one or more lines 312 and that are configured to connect to the one or more lines 312. In various cases, a bonding pad (e.g., similar to bonding pads 228 or via pads 210 or 222) could be connected to a top surface 326 of the one or more lines 320.

As shown in FIG. 8, the one or more lines 312 can extend up a first portion of the wall 314 of the channel 310 while the one or more lines 320 can extend down the wall 322 of the channel 318. In some cases, the one or more lines 312 might be a same length or about a same length as the wall 314 and the one or more lines 320 might be a same or about a same length as the wall 322. A top surface 324 of the one or more lines 312 can connect to a top surface 326 of the one or more lines 320. Alternatively, in other cases, the one or more lines 312 might be less than the height of the wall 314 and the one or more lines 320 might be less than the height of the wall 322. The difference in height between the one or more lines 312 or 320 and the corresponding wall 314 or 322 must be small enough to allow the one or more lines 312 or 320 to overcome the difference in height the corresponding wall 314 or 322 when the substrate 302 is heated. In this case, when the substrate 302 is heated, the one or more lines 312 and the one or more lines 320 can expand at a faster rate than the corresponding walls 314 or 322 of the substrate 302 and connect a top surface 324 of the one or more lines 312 to a top surface 326 of the one or more lines 320.

In some cases, the one or more lines 312, the one or more lines 320, the one or more walls 314, and/or the one or more walls 322 can be sloped (e.g., between about 20 degrees to about 87 degrees). In other cases, the one or more lines 312, the one or more lines 320, the one or more walls 314, and/or the one or more walls 322 can be about vertical (e.g., about 90 degrees from a bottom surface of the one or more channels 310 or 318).

In various cases, the one or more lines 312 and/or the one or more lines 320 can be configured to connect to one or more of one or more ridge vias (e.g., ridge vias 220 of FIGS. 2-7), one or more one or more via pads (e.g., via pads 210 and/or 222 of FIGS. 2-7), and/or one or more bonding pads (e.g., bonding pads 228 of FIGS. 2-7), and/or the like.

Figure 9:
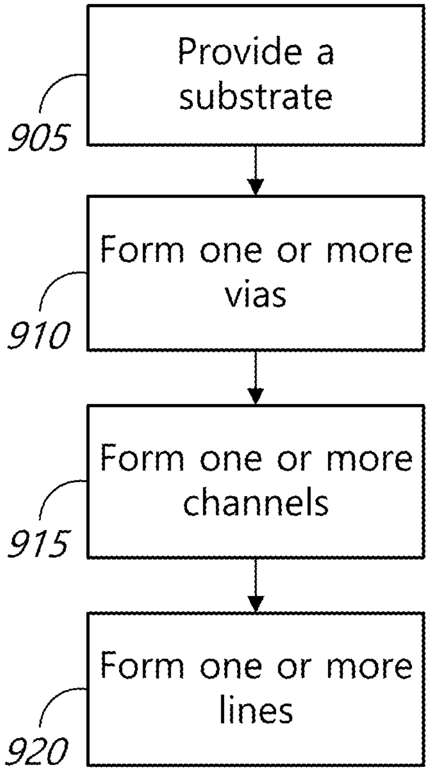
FIG. 9 is a flow diagram of a method of fabricating a semiconductor device with one or more channel vias, in accordance with various embodiments.

FIG. 9 is a flow diagram of a method of manufacturing a semiconductor device, in accordance with various embodiments. The method described in FIG. 9 is one way the components of FIGS. 1-8 can be manufactured. However, other methods (e.g., method 1000, method 1200, or other methods) may be used to manufacture the components of FIGS. 1-8.

Turning to FIG. 9, the method 900 may begin, at block 905, by providing a substrate (e.g., a substrate 102, 200, 302, or other component of a semiconductor device comprising one or more channels, or the like). Next, one or more vias (e.g., ridge vias, channel vias, or the like) can be formed within the substrate at block 910. In some cases, one or more channels can then be formed in the substrate to expose a top surface of the one or more channel vias at block 915. The method 900 can further include connecting one or more lines to a top surface of the one or more channel vias at block 920. The one or more lines can be configured to extend along a wall of a channel to a top surface of one or more ridges of the channel.

Figure 10:
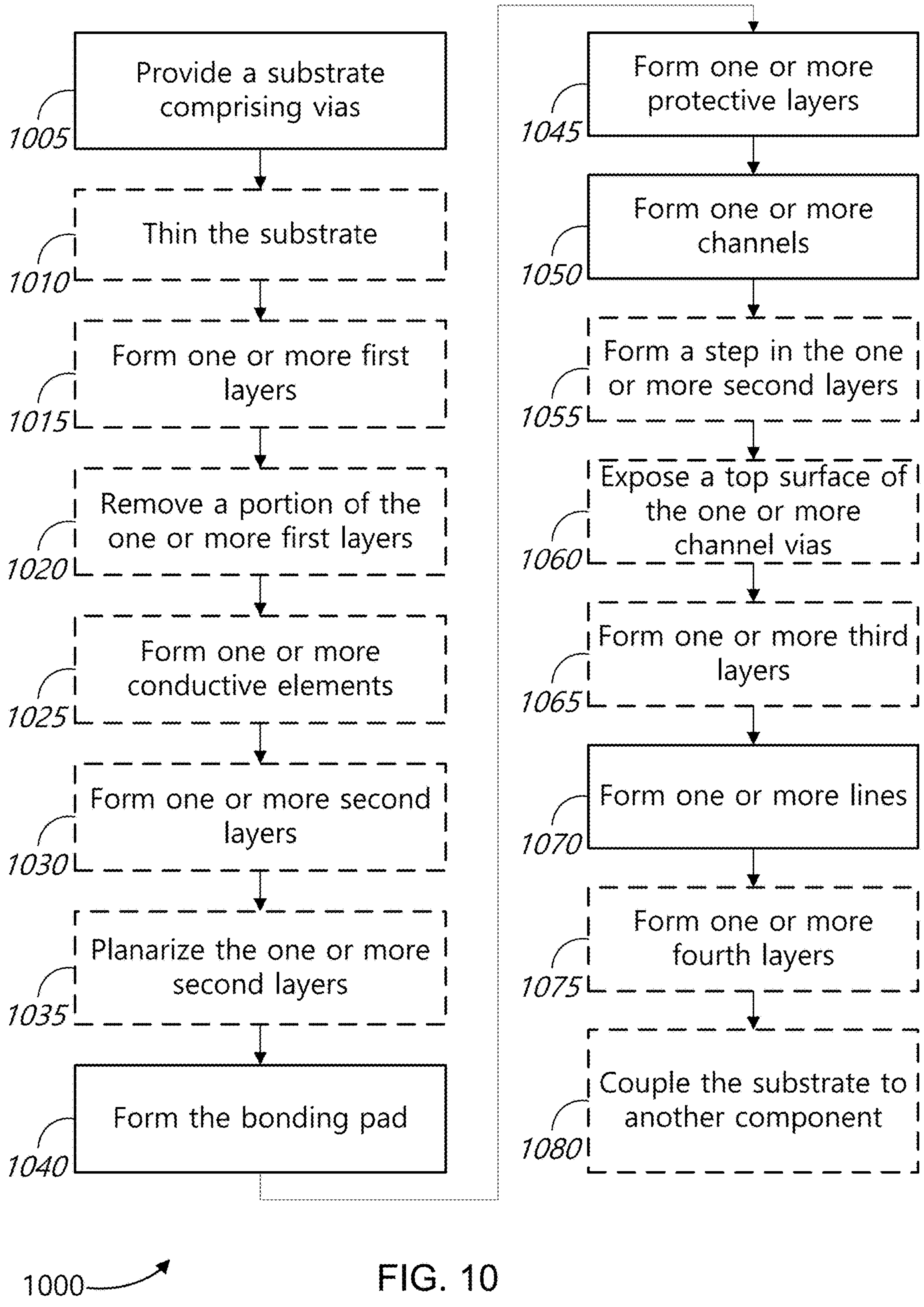
FIG. 10 is another flow diagram of a method of fabricating a semiconductor device with one or more channel vias, in accordance with various embodiments.

FIG. 10 is a flow diagram of a method 1000 of manufacturing a semiconductor device, in accordance with various embodiments. FIG. 11 is a cross-sectional view of the semiconductor device formed from the steps described in FIG. 10. The method described in FIG. 10 is one way the components of FIGS. 1-8 can be manufactured. However, other methods may be used to manufacture the components of FIGS. 1-8.

Figure 11A:
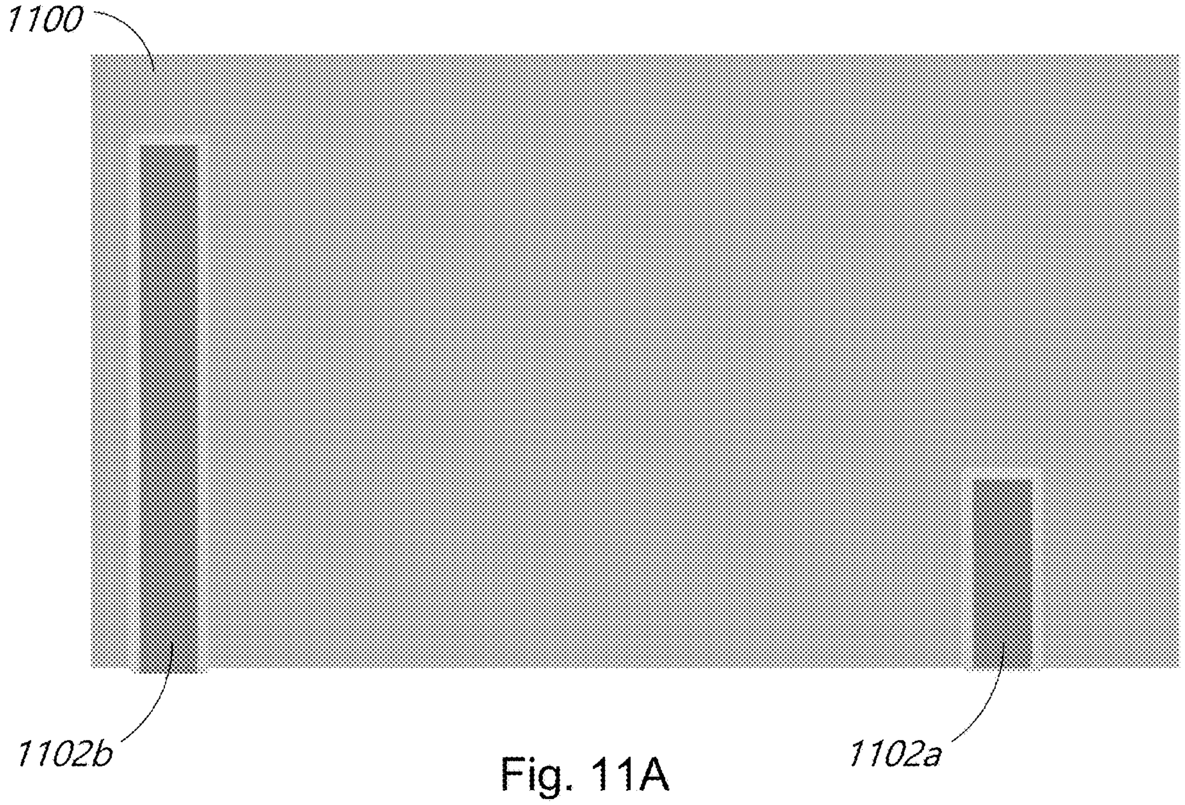
FIG. 11 is a schematic cross-sectional view of the method of FIG. 10, in accordance with various embodiments.

Turning to FIGS. 10 and 11, the method 1000 may begin, at block 1005 and FIG. 11A, by providing a substrate 1100 (e.g., a substrate 102, 200, 302, or other component of a semiconductor device comprising one or more channels, or the like) comprising one or more vias 1102. The vias 1102 could be one or more channel vias 1102*a* and/or ridge vias 1102*b*, as described above with respect to FIGS. 1-8. In various cases, the one or more channel vias and/or the one or more ridge vias can be formed at a same time, about a same time, or separately. In some cases, the one or more vias 1102 can be formed at a same time or about a same time as the substrate 1100. In some cases, the substrate 1100 can be provided with the vias already formed, but still buried within the substrate 1100 as shown in FIG. 11A.

Figure 11B:
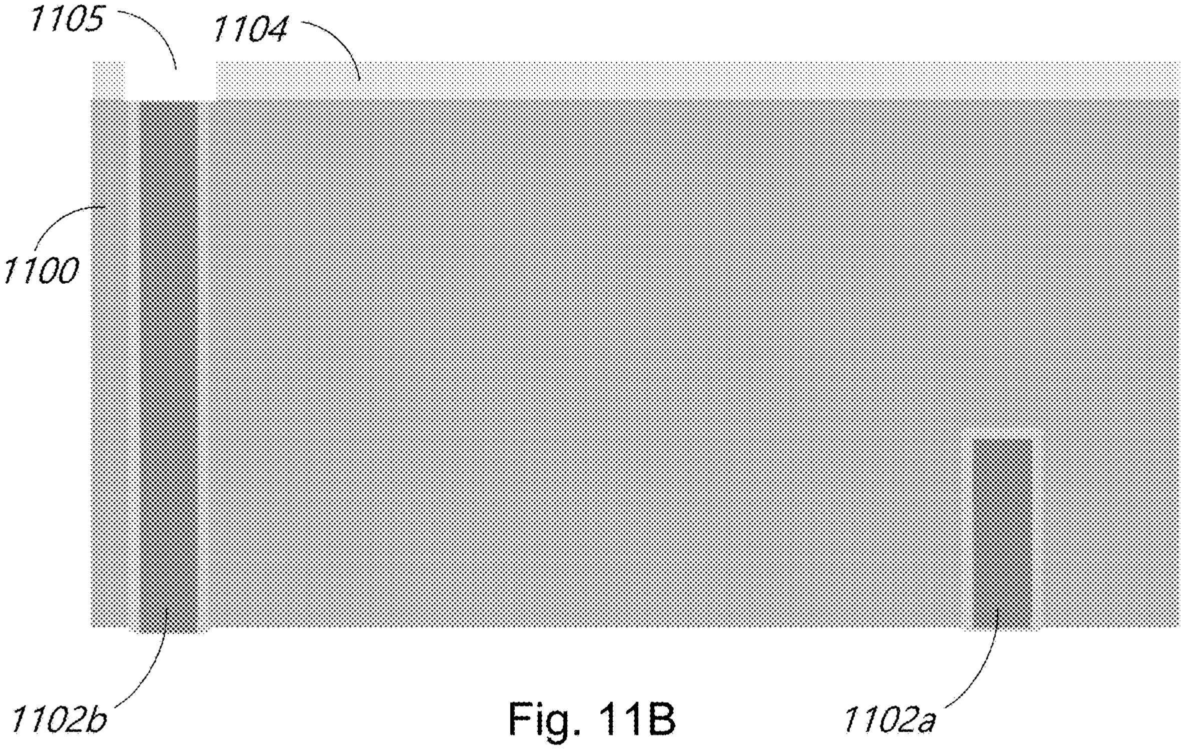
Figure 11C:
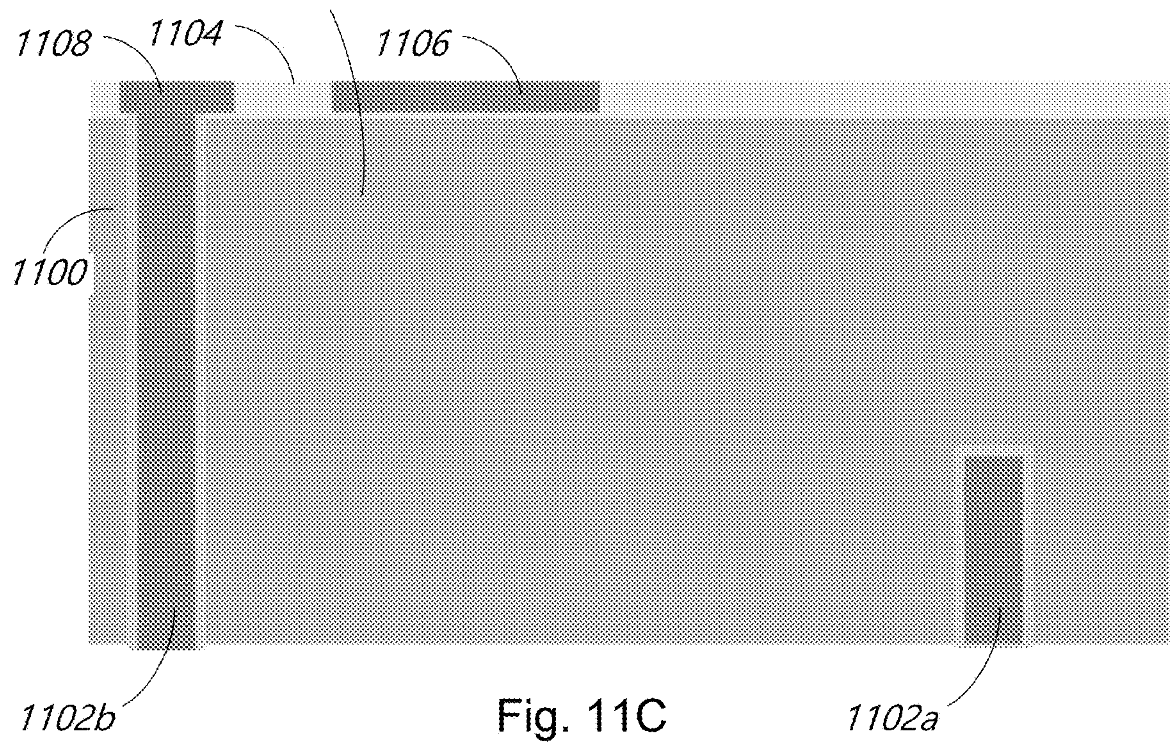

Next, at optional block 1010 and FIG. 11B, the substrate 1100 can be thinned (e.g., one or more of grinded, polished, or etched, or the like) to expose a top surface of the ridge vias 1102*b*. Further, at optional block 1015 and FIG. 11B, one or more first layers 1104 can be formed on a top portion of the substrate 1100. The one or more first layers 1104 can be one or more dielectric layers, insulating layers, or isolation layers. The one or more first layers 1104 can be formed from inorganic material such as silicon dioxide, silicon oxide, and/or another other material suitable for use as a dielectric layer, insulating layer, or isolation layer.

In some cases, the one or more first layers 1104 (e.g., one or more isolation oxide layers or the like) can be deposited only at selected locations where one or more lines, via pads, bonding pads, etc. are formed. In other cases, at optional block 1020 and FIG. 11B, one or more portions of the one or more first layers 1104 can be removed (e.g., etched, removed using photolithography, or the like) at selected locations where one or more lines, via pads, bonding pads, etc. are to going to be formed. In some embodiments, the one or more portions of the one or more layers 1104 can be removed to expose a top surface of the vias (e.g., vias 1102*b*). In some cases, the one or more portions of the one or more layers 1104 can be removed in order to deposit one or more via pads, bonding pads, or the like. In some cases, a portion of the one or more layers 1104 might be configured to remain under the one or more lines, via pads, bonding pads, etc. to isolate the one or more lines, via pads, bonding pads, etc. from a top surface of the substrate 1100. In various cases, a seed layer can be formed. The seed layer can be used to facilitate an electrical connection between one or more conductive elements or as a barrier or adhesion layer to help the metal of a conductor adhere to a dielectric layer or the like.

Figure 11D:
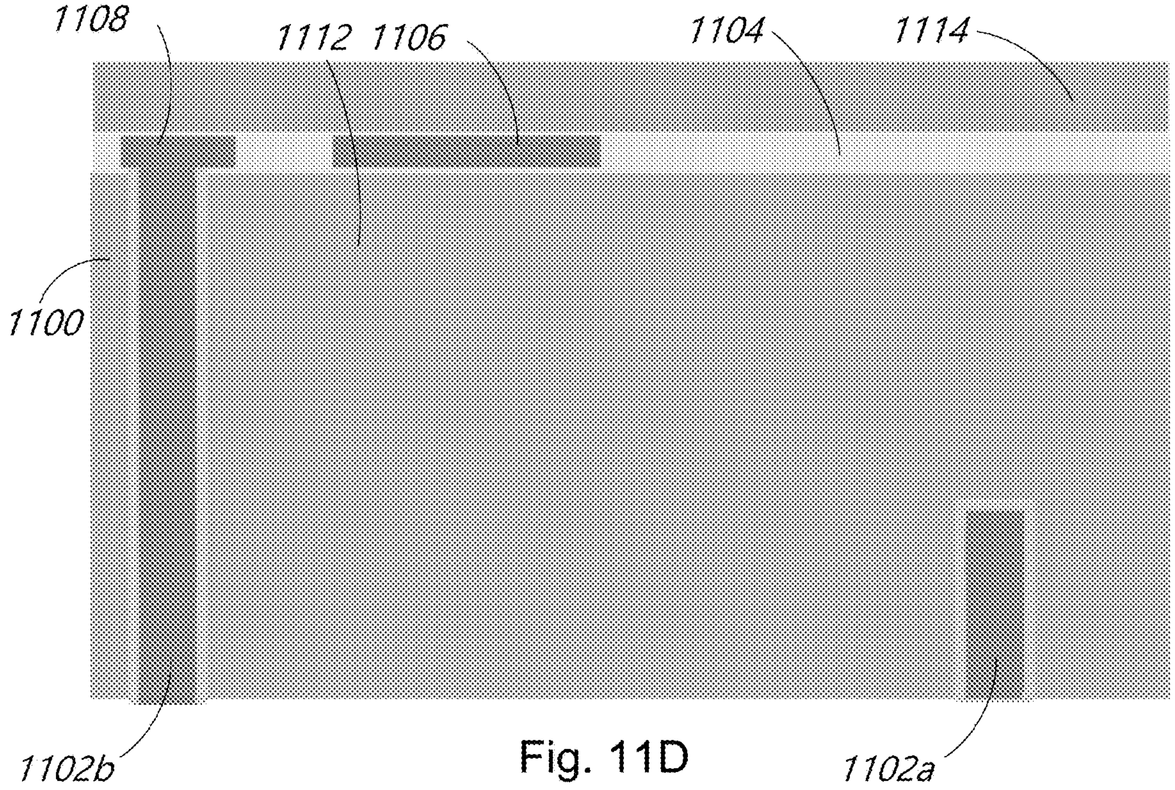
Figure 11E:
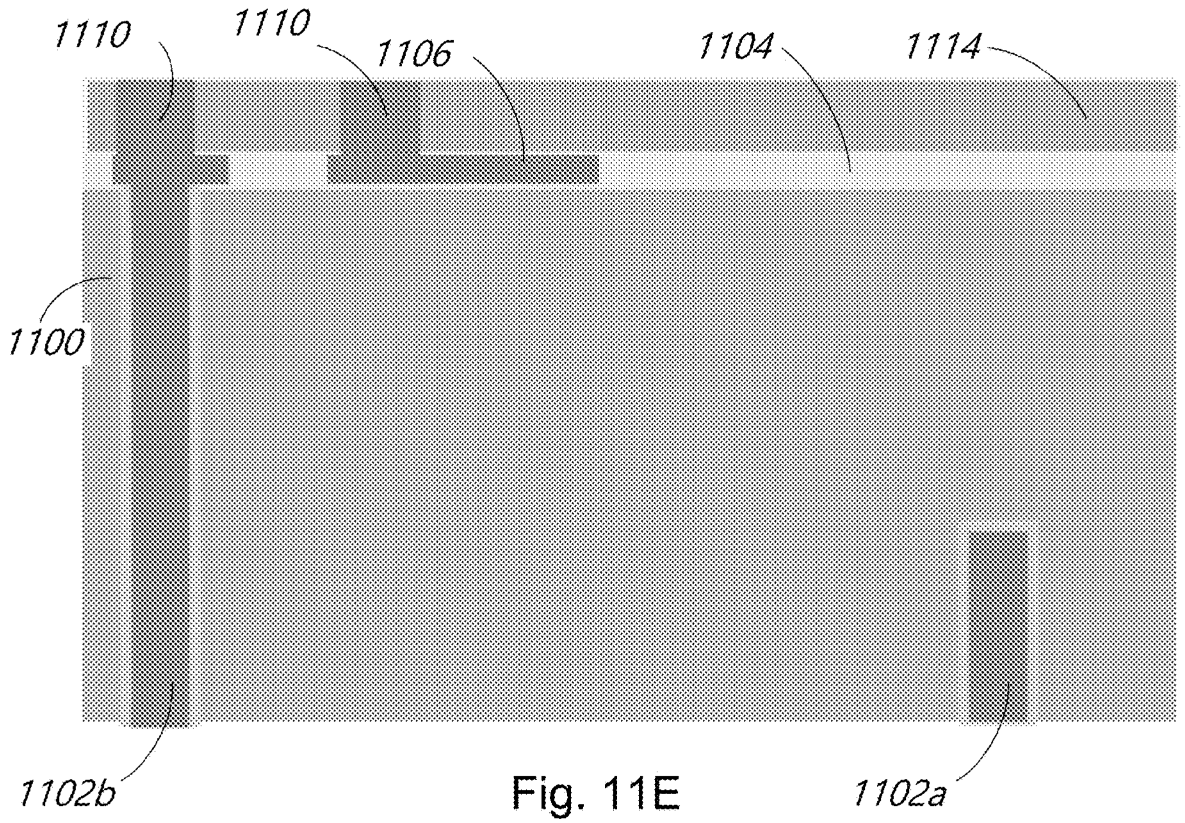
Figure 11F:
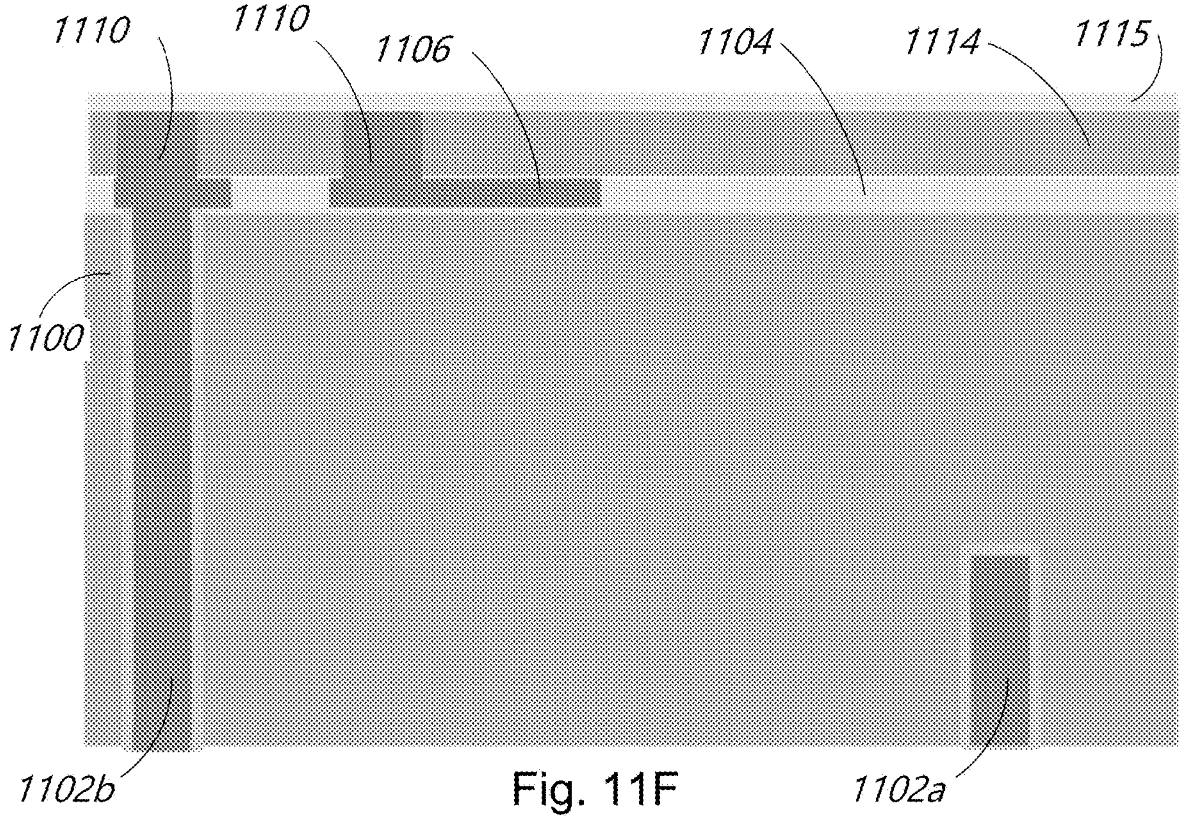

Next, at optional block 1025 and FIG. 11E, one or more conductive elements (e.g., an optional portion of the one or more lines 1106 (e.g., one or more lines 214, 312, or the like), one or more via pads 1108 (e.g., via pads 222, or the like), and/or one or more bonding pads 1110 (e.g., bonding pads 228, or the like)) can be formed on a top portion of a ridge 1112. In various cases, the conductive elements can be formed in the selected locations where the one or more layers 1104 were removed. In various cases, the one or more lines 1106, one or more via pads 1108, and/or one or more bonding pads 1110 can be formed on top of the one or more first layers 1104 or within one or more removed portions 1105 of the one or more first layers 1104.

Next, at block 1030 and FIG. 11D, the method 1000 can include forming one or more second layers 1114 (e.g., one or more silicon oxide layers or the like) on the top portion of the substrate 1100, the one or more first layers 1104, the one or more lines 1106, the one or more via pads 1108, and/or the one or more bonding pads 1110, or the like. The one or more second layers 1114 can be one or more dielectric layers, insulating layers, or isolation layers. The one or more second layers 1114 can be used to form a bond surface (e.g., a zero-clearance bonding surface, a hybrid bonding surface, or the like) and be used as an interface between the substrate 1100 and another component of the semiconductor device or layer of the substrate 1100. The one or more second layers 1114 can then be planarized, at optional block 1035 and FIG. 11D, to ensure that a top surface of the one or more second layers is substantially level. In various cases, the one or more second layers can be planarized to be optionally level with and to optionally expose a top surface of the one or more via pads 1108 and/or the one or more bonding pads 1110 as shown in FIG. 11G.

Next, at optional block 1040 and FIG. 11E, one or more bonding pads 1110 (e.g., zero-clearance bonding pads, or the like) can be formed in the one or more second layers. The bonding pad 1110 can be used to connect the lines 1106 and/or vias 1102*b* of the substrate 1100 to one or more conductive elements located on another component configured to couple to the substrate. In some cases, at optional block 1045 and FIG. 11F, one or more thin protective layers 1115 can then be formed or deposited on the one or more second layers 1114 to protect the top surface of the one or more via pads 1108 and/or the one or more bonding pads 1110.

Figure 11G:
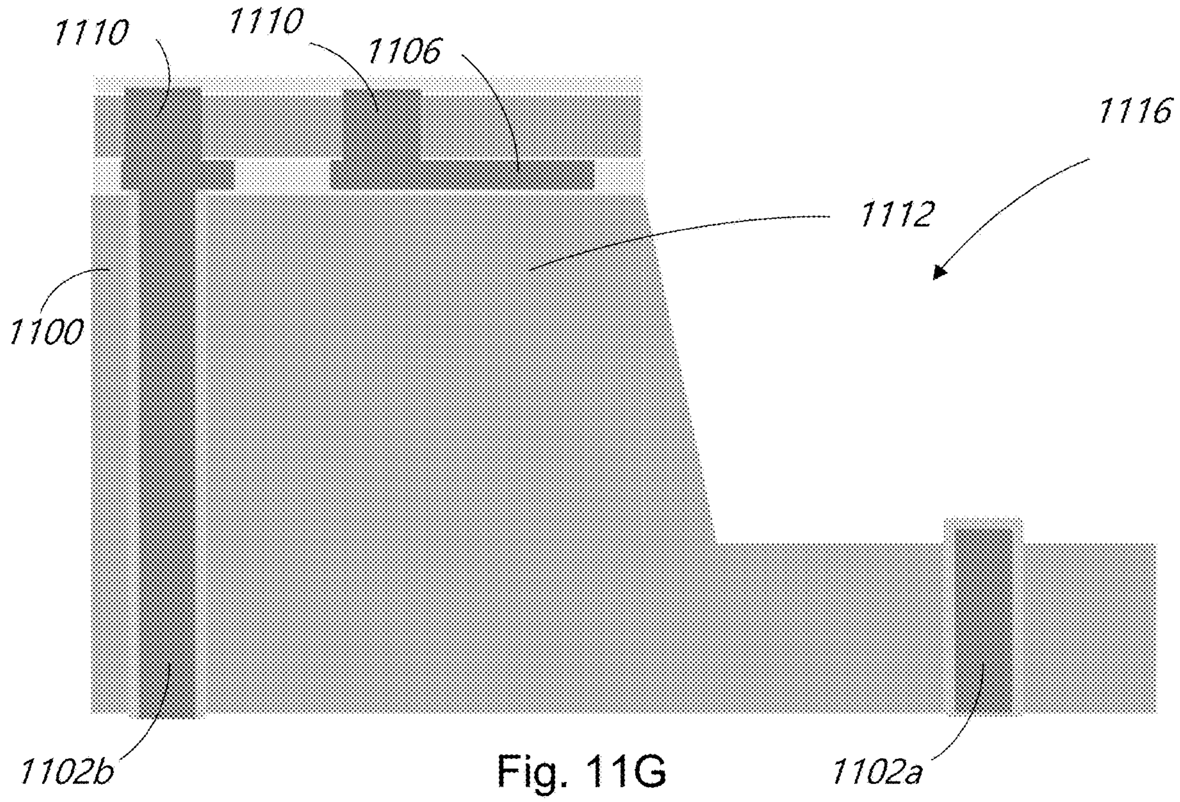
Figure 11H:
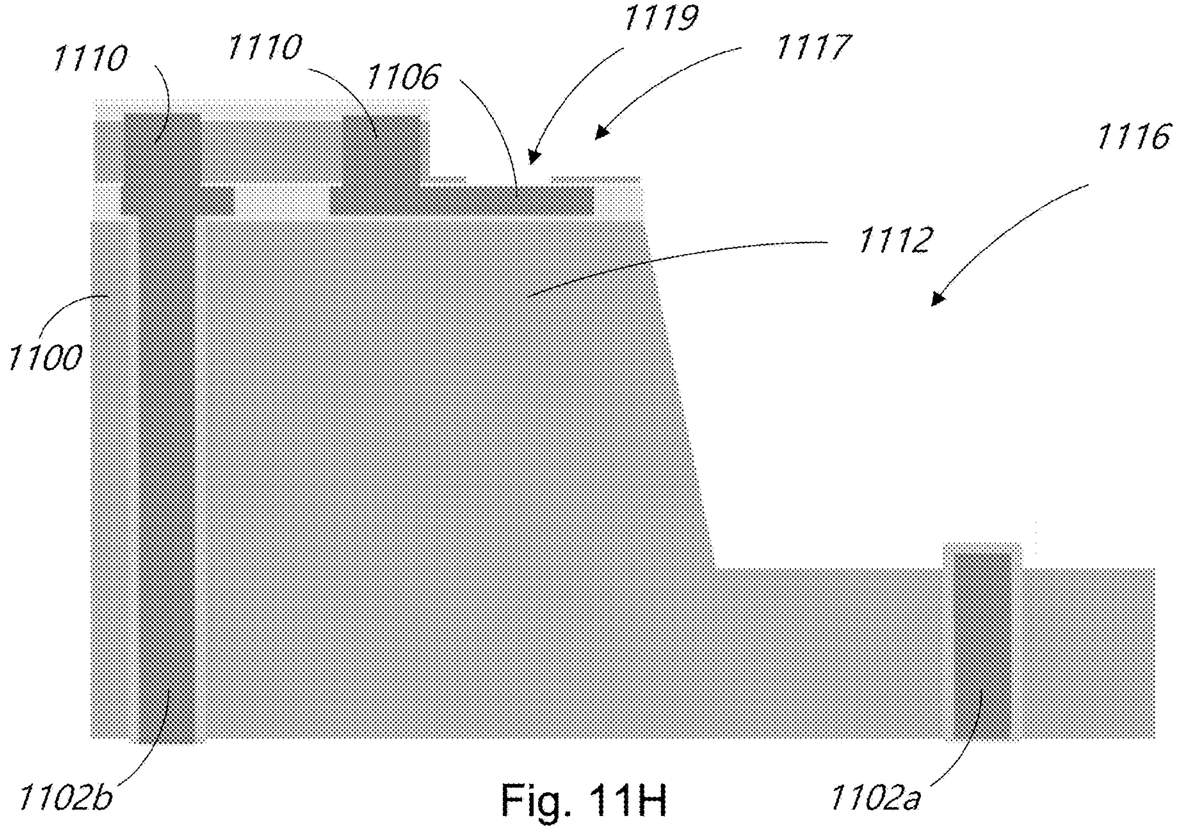

The method 1000 can continue at block 1050 and FIG. 11G and form the one or more channels 1116 (e.g., channels 108, 202, 310, 318 or the like). The one or more channels 1116 can be formed to expose a top surface of the one or more channel vias 1102*a* at the bottom surface of the one or more channels 1116. For example, an etching process can be used to etch the substrate 1100 to expose a top surface of the one or more vias 1102*a* and form the one or more channels 1116. The method 1000 can then optionally include, at block 1050 and FIG. 11H, forming (e.g., etching) a step 1117 in the one or more second layers 1114 and/or one or more protective layers 1115 above the one or more portions of the lines 1106. In some cases, the step 1117 could be fully etched to reveal the one or more portions of the lines 1106. Alternatively, in other cases, the step 1117 could be etched until a particular thickness of the or more second layers 1114 is achieved and then an opening or hole 1119 that is less than a length of the one or more portions of the lines 1106 could be formed. In some cases, at optional block 1060, a top surface of the one or more channels 1116 can be etched to expose a top surface of the one or more channel vias 1102*a* at the bottom surface of the one or more channels 1116.

Figure 11I:
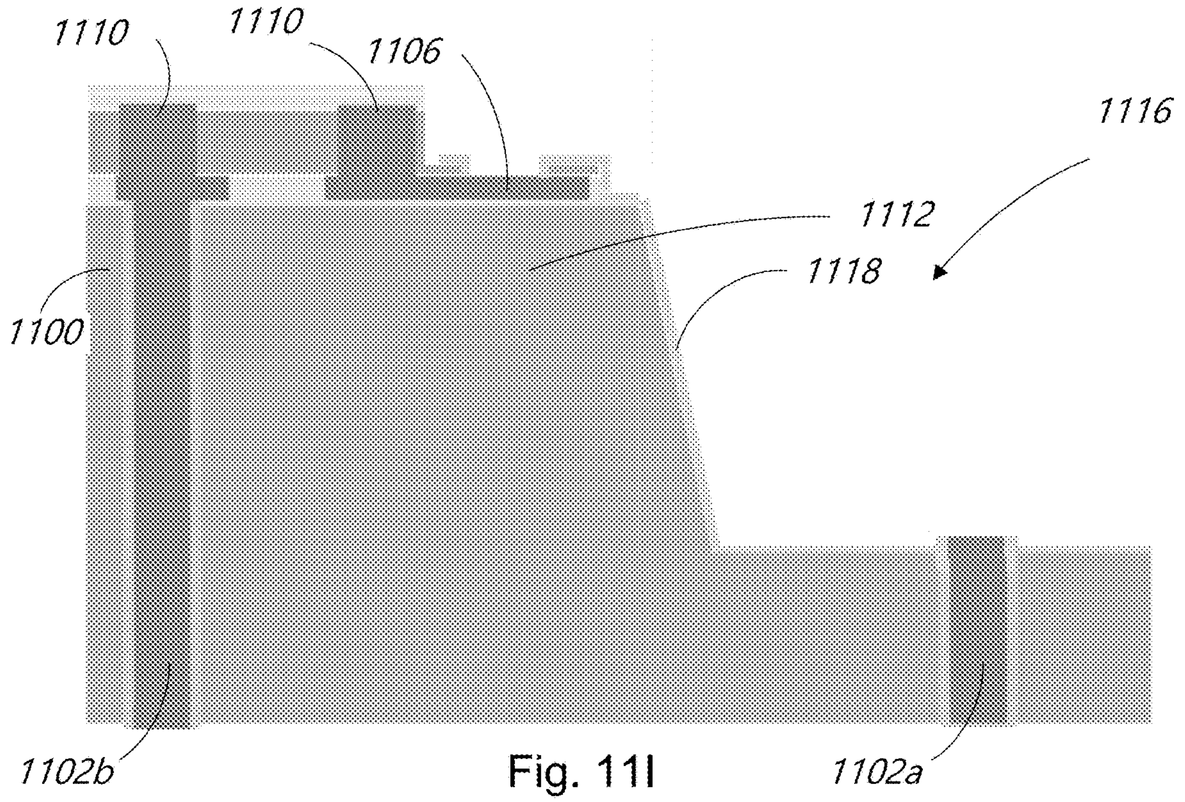

The method 1000 can then continue to optional block 1065 and FIG. 11I and form one or more third layers 1118 on one or more walls of the one or more channels 1116. The one or more third layers 1118 can be one or more dielectric layers or insulating layers. The one or more third layers can be formed from a photodefinable polyimide or other dielectric material. The photodefinable polyimide or other dielectric material can be selected based on one or more materials of the substrate 1100, or layers 1104, 1114, 1115, or the like. The one or more third layers 1118 can be deposited only at selected locations where one or more lines, via pads, bonding pads, etc. are formed. In other cases, the one or more third layers 1118 can be removed at selected locations where one or more lines pads, via pads, hybrid bonding pads, etc. are not formed. In some cases, one or more portions of the one or more third layers 1118 can then be removed to expose a top surface of the vias (e.g., vias 1102). For example, an etching process can be used to etch the one or more third layers 1118 to expose a top surface of the one or more vias 1102*a*.

Figure 11J:
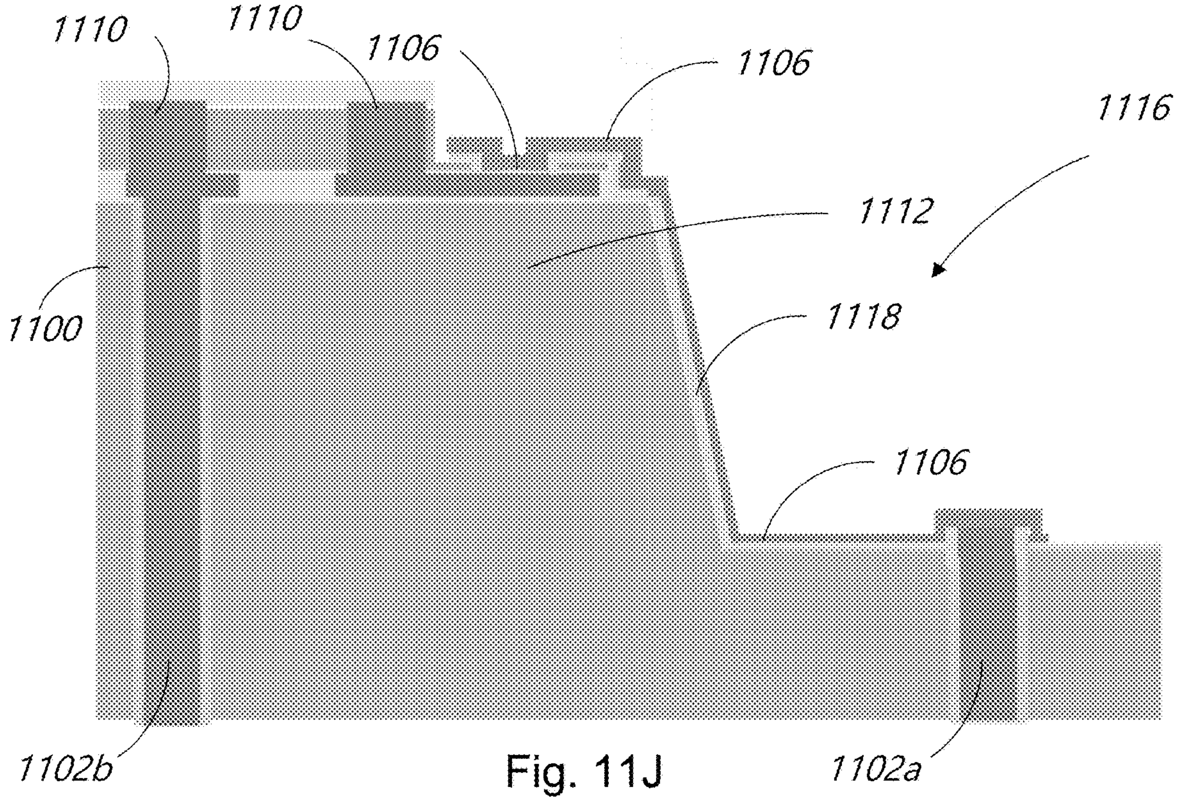

The method 1000 can then continue to block 1070 and FIG. 11J and form at least a portion of the one or more lines 1106 on top of the one or more third layers 1118. The portions of the one or more lines 1106 formed on the one or more third layers 1118 can be connected to one or more of the one or more vias 1102*a*, the one or more vias 1102*b*, one or more portions of the lines 1106 at a top surface of the one or more ridges 1112, one or more via pads 1108, and/or one or more bonding pads 1110.

Figure 11K:
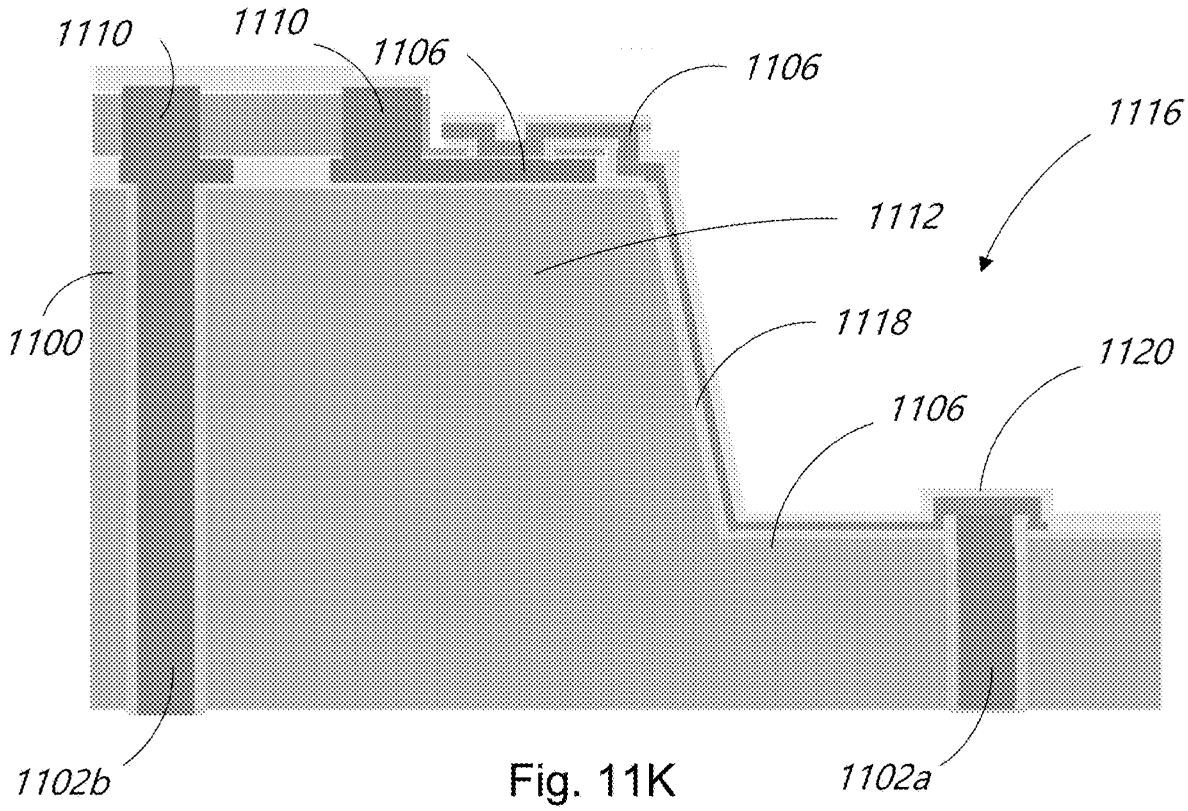

Next, the method 1000 can then continue to optional block 1075 and FIG. 11K and form one or more fourth layers 1120 on and/or encapsulating the one or more lines 1106 formed on the one or more walls of the one or more channels and/or on a top of the one or more lines 1106 formed on a top surface of the one or more ridges 1112. The one or more fourth layers 1120 can be one or more dielectric layers or insulating layers. The one or more fourth layers 1120 can be formed from a photodefinable polyimide or other dielectric material. The one or more fourth layers 1120 can be deposited only at selected locations where one or more lines, via pads, hybrid bonding pads, etc. are formed. In other cases, the one or more fourth layers 1120 can be removed at selected locations where one or more lines pads, via pads, hybrid bonding pads, etc. are not formed. In various cases, in order to ensure a smooth bonding surface between the one or more bonding pads 1110 and another component (e.g., device die or the like) of a semiconductor device, a height of the one or more fourth layers 1120 might be less than a height of the one or more second layers 1114. In other words, a top surface of the one or more fourth layers 1120 might be lower than a top surface of the one or more second layers 1114.

Finally, the substrate 1100 can be cleaned and the one or more optional thin protective layers used to protect the top surface of the one or more via pads 1108 and/or the one or more bonding pads 1110 can be removed from the one or more second layers 1114. In some cases, a top surface of the substrate 1100 can be formed by using chemical mechanical planarization processes to prepare the substrate 1100 to be coupled to another component. Next, at optional block 1080, the substrate 1100 can be coupled to another component (e.g., device die, another layer of the substrate 1100, or the like) of a semiconductor device. When the substrate 1100 is coupled to another component of the semiconductor device, the one or more via pads 1108 and/or the one or more bonding pads 1110 can be connected to one or more conductive elements (e.g., via pads, bonding pads, or the like) of the other component of the semiconductor device.

The techniques and processes described above with respect to various embodiments may be used to manufacture the semiconductor devices or components of FIGS. 1-8, and/or components thereof, as described herein. Alternatively, other processes can be used to manufacture the semiconductor devices or components of FIGS. 1-8.

Figure 12:
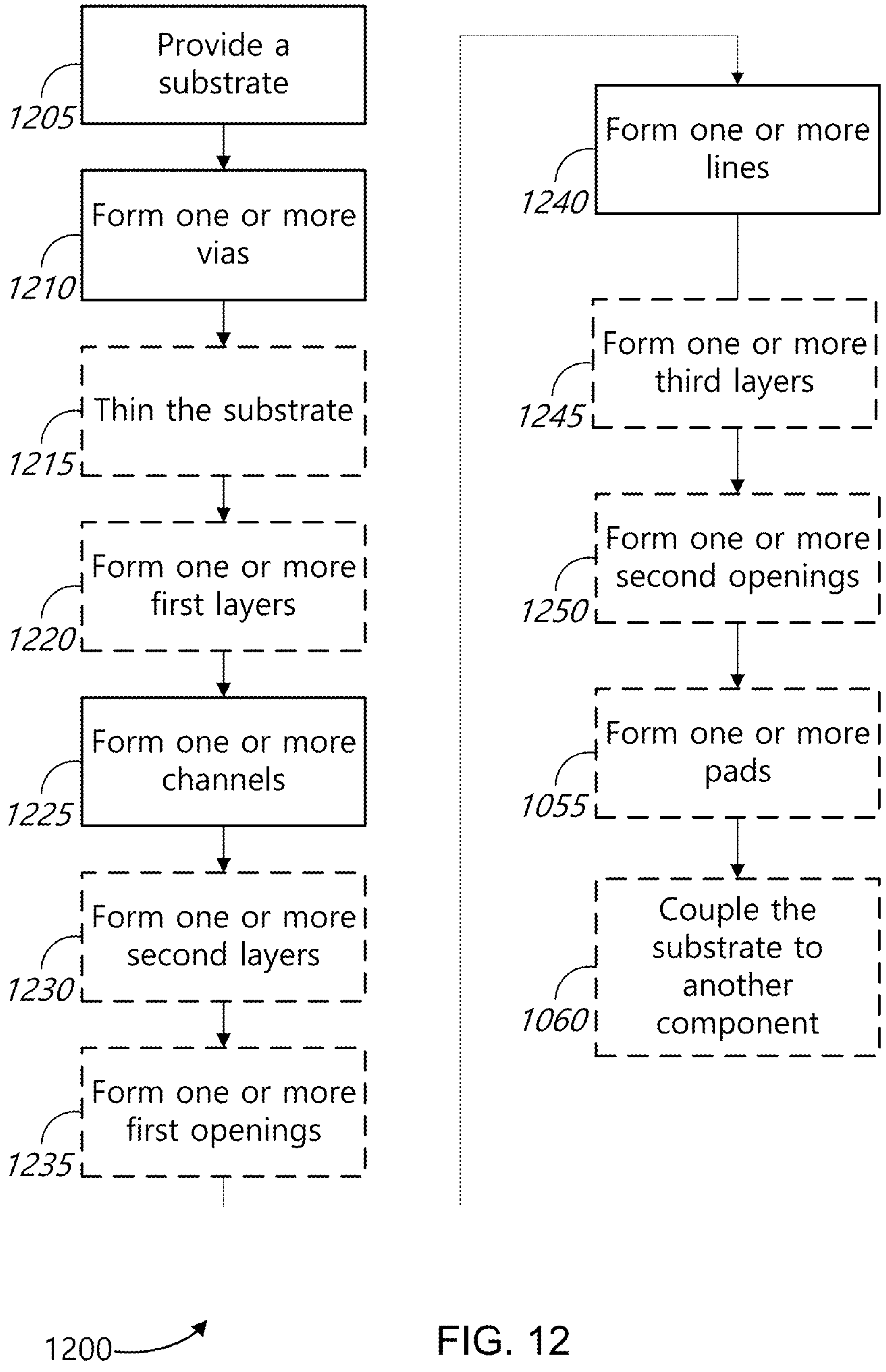
FIG. 12 is yet another flow diagram of a method of fabricating a semiconductor device with one or more channel vias, in accordance with various embodiments.
Figure 13:
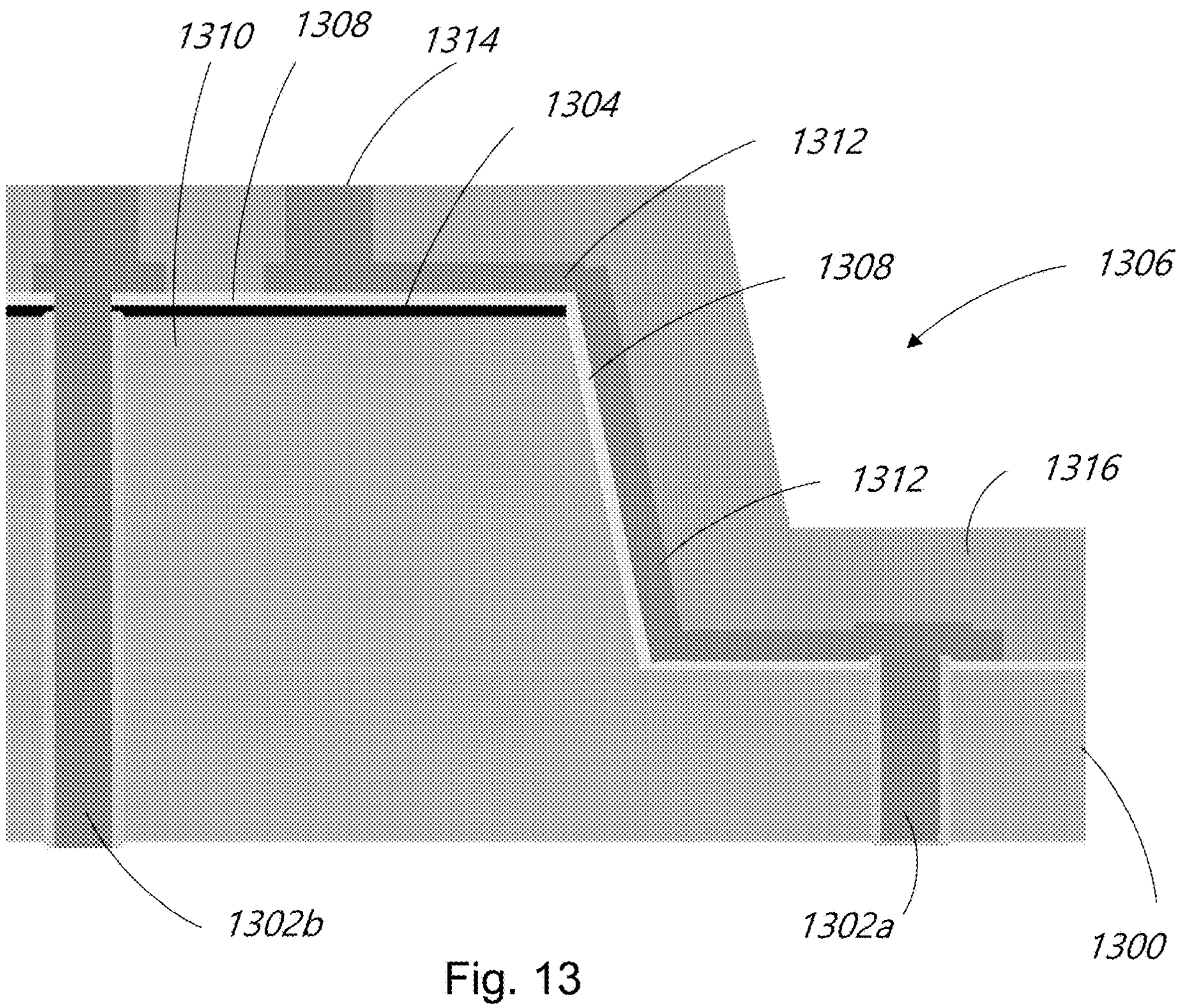
FIG. 13 is a schematic cross-sectional view of a bottom part of a substrate formed using the method of FIG. 12.

FIG. 12 is a flow diagram of a method 1200 of manufacturing a semiconductor device, in accordance with various embodiments. The method described in FIG. 12 is one way the components of FIGS. 1-8 can be manufactured. However, other methods may be used to manufacture the components of FIGS. 1-8. FIG. 13 shows one possible embodiment of a substrate 1300 manufactured using the method of FIG. 12.

The method 1200 may begin, at block 1205, by providing a substrate 1300 (e.g., a substrate 102, 200, 302, or other component of a semiconductor device comprising one or more channels, or the like) and, at block 1210, forming one or more vias 1302. The vias could be one or more channel vias 1302*a* and/or ridge vias 1302*b*, as described above with respect to FIGS. 1-8. In various cases, the one or more channel vias 1302*a* and/or the one or more ridge vias 1302*b* can be formed at a same time, about a same time, or separately.

Next, at optional block 1215 (not shown in FIG. 11), the substrate 1300 can be thinned to expose a top surface of the ridge vias 1302*b*. Further, at optional block 1220 and FIG. 11C, one or more first layers 1304 can be formed on a top portion of the substrate 1300. The one or more first layers 1304 can be one or more dielectric layers, insulating layers, or isolation layers. The one or more first layers 1304 can be formed from inorganic material such as silicon dioxide, silicon oxide, and/or another other material suitable for use as a dielectric layer, insulating layer, or isolation layer.

The method 1200 can continue at block 1225 and form the one or more channels 1306 (e.g., channels 108, 202, 310, 318 or the like). The one or more channels 1306 can be formed to expose a top surface of the one or more channel vias 1302*a* at the bottom surface of the one or more channels 1306. For example, an etching process can be used to etch the substrate 1300 to expose a top surface of the one or more vias 1302*a* and form the one or more channels 1306. The method 1200 can then optionally include, at block 1230, forming one or more second layers 1308 on a top portion of a ridge 1310 of the channel 1306 and on a top surface of the channel 1306. The one or more second layers 1308 can be one or more dielectric layers, insulating layers, or isolation layers. The one or more second layers 1308 can be formed from inorganic material such as silicon dioxide, silicon oxide, and/or another other material suitable for use as a dielectric layer, insulating layer, or isolation layer.

Next, method 1200, at optional block 1235 can include forming one or more first openings in the one or more first layers 1304 and/or the one or more second layers 1308 to expose a surface of the one or more channel vias 1302*a* and/or the one or more ridge vias 1302*b*. The method 1200 can then continue to block 1240 and form at least a portion of the one or more lines 1312 and/or bonding pads 1314 on top of the one or more second layers 1308. In some cases, the one or more bonding pads 1314 can be formed at optional blocks 1250 and 1255. The portions of the one or more lines 1312 formed on the one or more second layers 1308 can be connected to one or more of the one or more vias 1302 through the one or more first openings, other portions of the lines 1312, and/or one or more bonding pads 1314.

The method 1200 can include, at optional block 1245, depositing one or more third layers 1316 on top of the one or more lines 1312. The one or more third layers 1316 can be one or more dielectric layers, insulating layers, or isolation layers. The one or more third layers 1316 can be used to form a bond surface (e.g., a zero-clearance bonding surface, a hybrid bonding surface, or the like) and be used as an interface between the substrate 1300 and another component of the semiconductor device or layer of the substrate 1300. The one or more third layers 1316 can then be planarized to ensure that a top surface of the one or more third layers is substantially level.

Next, method 1200, at optional block 1250 can include forming one or more second openings in the one or more third layers 1316 to expose a surface of the one or more lines 1312 at a top surface of the one or more ridges 1310. A bonding pad 1314 could then be formed within the one or more second openings and connected to the one or more lines 1312 at optional block 1255.

Finally, the substrate 1300 can be cleaned and the surface of the ridge 1310 can be planarized. Next, at optional block 1260, the substrate 1300 can be coupled to another component (e.g., device die, another layer of the substrate 1300, or the like) of a semiconductor device. When the substrate 1300 is coupled to another component of the semiconductor device, one or more via pads and/or one or more bonding pads 1314 can be connected to one or more corresponding conductive elements (e.g., via pads, bonding pads, or the like) of the other component of the semiconductor device.

While some features and aspects have been described with respect to the embodiments, one skilled in the art will recognize that numerous modifications are possible. Moreover, while the procedures of the methods and processes described herein are described in a particular order for ease of description, unless the context dictates otherwise, various procedures may be reordered, added, and/or omitted in accordance with various embodiments. Moreover, the procedures described with respect to one method or process may be incorporated within other described methods or processes; likewise, system components described according to a particular structural architecture and/or with respect to one system may be organized in alternative structural architectures and/or incorporated within other described systems. Hence, while various embodiments are described with or without some features for ease of description and to illustrate aspects of those embodiments, the various components and/or features described herein with respect to a particular embodiment can be substituted, added and/or subtracted from among other described embodiments, unless the context dictates otherwise. Consequently, although several embodiments are described above, it will be appreciated that the invention is intended to cover all modifications and equivalents within the scope of the following claims.

What is claimed is:

1. A semiconductor device comprising:

a first layer comprising a channel;

a first via extending though the first layer to a first surface of the channel, wherein the first surface is located at a bottom of the channel;

a second via, wherein the first via and the second via are offset from one another, a line connecting the first via to a pad located on a ridge of the channel, wherein the pad is connected to the second via, wherein the line is formed on the bottom of the channel and an interior surface of a first wall of the channel.

2. The semiconductor device of claim 1, wherein the second via extends into a second layer disposed on the first layer.

3. The semiconductor device of claim 1, wherein the second via extends through the first layer.

4. The semiconductor device of claim 1, wherein the first wall of the channel is sloped.

5. The semiconductor device of claim 4, wherein the first wall is sloped between about 20 degrees and about 87 degrees.

6. The semiconductor device of claim 1, wherein a second layer is located between the first wall of the channel and the line.

7. The semiconductor device of claim 2, wherein the ridge further comprises the second via extending to a second surface of the ridge, wherein the second surface is located at a top of the ridge.

8. The semiconductor device of claim 6, wherein a diameter of the first via is less than a diameter of the second via.

9. The semiconductor device of claim 1, wherein a second layer is partially formed on the first layer to encapsulate at least one of a top of the first via or the line connecting the first via to the pad.

10. The semiconductor device of claim 1, wherein the channel comprises a fluid, and wherein a second layer is formed at a location to encapsulate a portion of the line, wherein the location is selected to prevent the portion of the line from contacting the fluid in the channel.

11. The semiconductor device of claim 1, wherein, when the pad is located on top of the ridge of the channel, the semiconductor device further comprising:

a second layer encapsulating the line; and a third layer located on top of the ridge encapsulating the pad, wherein a top surface of the second layer is lower than a top surface of the third layer.

12. A semiconductor device comprising:

an array of vias, the array of vias comprising at least one first via extending through a first layer to a bottom of a channel and at least one second via offset from the at least one first via; and a line extending along a portion of the channel and connecting the at least one first via to a pad located on a ridge of the channel, wherein the pad is connected to the at least one second via, wherein the line is formed on the bottom of the channel and an interior surface of a wall of the channel.

13. The semiconductor device of claim 12, wherein the at least one second via extends into a second layer disposed on the first layer.

14. The semiconductor device of claim 12, wherein the array of vias comprises two or more vias arranged in two or more columns or two or more rows along the bottom of the channel.

15. The semiconductor device of claim 12, wherein the array of vias comprises the at least one second via extending through the first layer to a top of the ridge of the channel.

16. The semiconductor device of claim 12, the pad comprises a zero-clearance bondable surface.

17. A method of manufacturing a semiconductor device, the method comprising:

forming a first via extending through a first layer;

forming a channel in the first layer to expose a first surface of the first via, wherein the first surface of the first via is exposed on a bottom surface of the channel;

forming a second via offset from the first via; and forming a line extending from the first surface of the first via and configured to connect the first via to a pad located on a ridge of the channel, wherein the pad is connected to the second via, wherein the line is formed on a bottom of the channel and an interior surface of a first wall of the channel.

18. The method of claim 17, further comprising:

after forming the channel and before forming the line, forming a second layer on top of the first layer comprising the channel, wherein the second layer is a dielectric layer.

19. The method of claim 18, further comprising:

after forming the line, forming a third layer on top of the line, wherein the third layer is a dielectric layer.

20. The method of claim 17, wherein the second via extends into a second layer disposed on the first layer or wherein the second via extends into the first layer.

* * * * *